United States Patent
Curry et al.

(10) Patent No.: US 12,302,763 B1
(45) Date of Patent: May 13, 2025

(54) QUANTUM DOT DEVICES WITH MULTIPLE BARRIER GATES BETWEEN ADJACENT PLUNGER GATES

(71) Applicant: Intel Corporation, Santa Clara, CA (US)

(72) Inventors: Matthew Jon Curry, Beaverton, OR (US); Hubert C. George, Portland, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 124 days.

(21) Appl. No.: 17/695,717

(22) Filed: Mar. 15, 2022

(51) Int. Cl.
*H10N 60/10* (2023.01)
*G06N 10/00* (2022.01)
*G06N 10/40* (2022.01)
*H01L 29/66* (2006.01)
*H03K 17/92* (2006.01)
*H10D 48/00* (2025.01)
*H10N 69/00* (2023.01)

(52) U.S. Cl.
CPC ........... *H10N 60/128* (2023.02); *G06N 10/00* (2019.01); *G06N 10/40* (2022.01); *H03K 17/92* (2013.01); *H10D 48/383* (2025.01); *H10N 60/11* (2023.02); *H10N 69/00* (2023.02)

(58) Field of Classification Search
CPC ...... H10N 60/128; H10N 60/11; H10N 69/00; G06N 10/40; G06N 10/00; H03K 17/92; H01L 29/66977

USPC ....................... 257/14, 30; 438/257; 327/109
See application file for complete search history.

(56) References Cited

U.S. PATENT DOCUMENTS

2023/0196166 A1* 6/2023 Mohiyaddin .......... G06N 10/40
257/30

OTHER PUBLICATIONS

Hendrickx et al https://arxiv.org/pdf/1912.10426.pdf Single Hole Spin Qubit (Year: 2019).*
PhysOrg.com (Sep. 2011) Playing Ping Pong with single electrons. Sep. 22, 2011 Cavendish Labs/ Cambridge UK.*

* cited by examiner

*Primary Examiner* — Arnold M Kinkead
(74) *Attorney, Agent, or Firm* — Akona IP PC

(57) ABSTRACT

Quantum dot devices with multiple barrier gates between adjacent plunger gates are disclosed. Multiple barrier gates between two adjacent plunger gates are coupled to respective signal sources and may be individually controlled by signals being applied to one or more of the multiple barrier gates to control electrostatics so that the potential barrier between quantum dots formed under adjacent plunger gates may be adjusted. Appropriate signals are to be applied to two or more of the multiple barrier gates between a pair of adjacent plunger gates in order to realize sufficient coupling of quantum dots. Such quantum dot devices provide strong spatial localization of the quantum dots, good control over quantum dot interactions and manipulation, good scalability in the number of quantum dots included in the device, and/or design flexibility in making electrical connections to the quantum dot devices to integrate the quantum dot devices in larger computing devices.

20 Claims, 20 Drawing Sheets

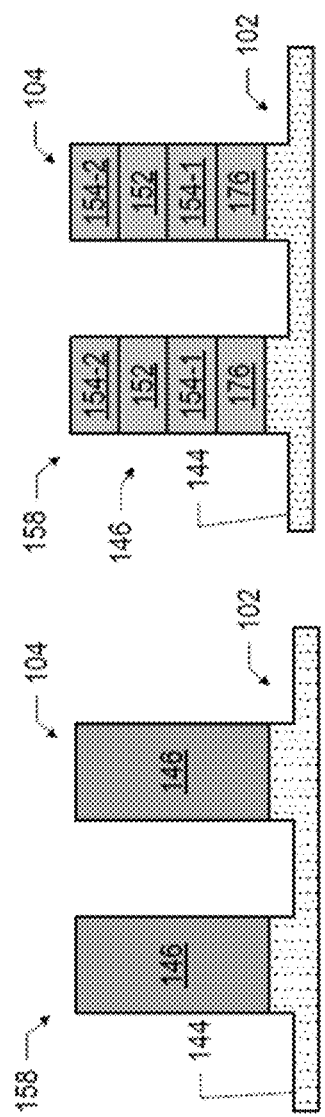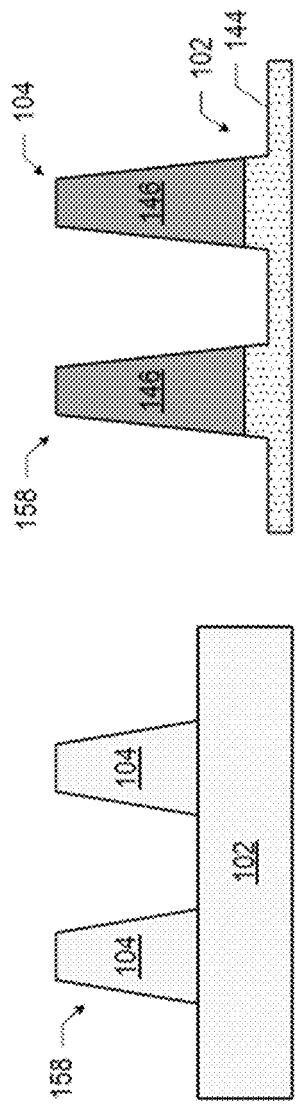

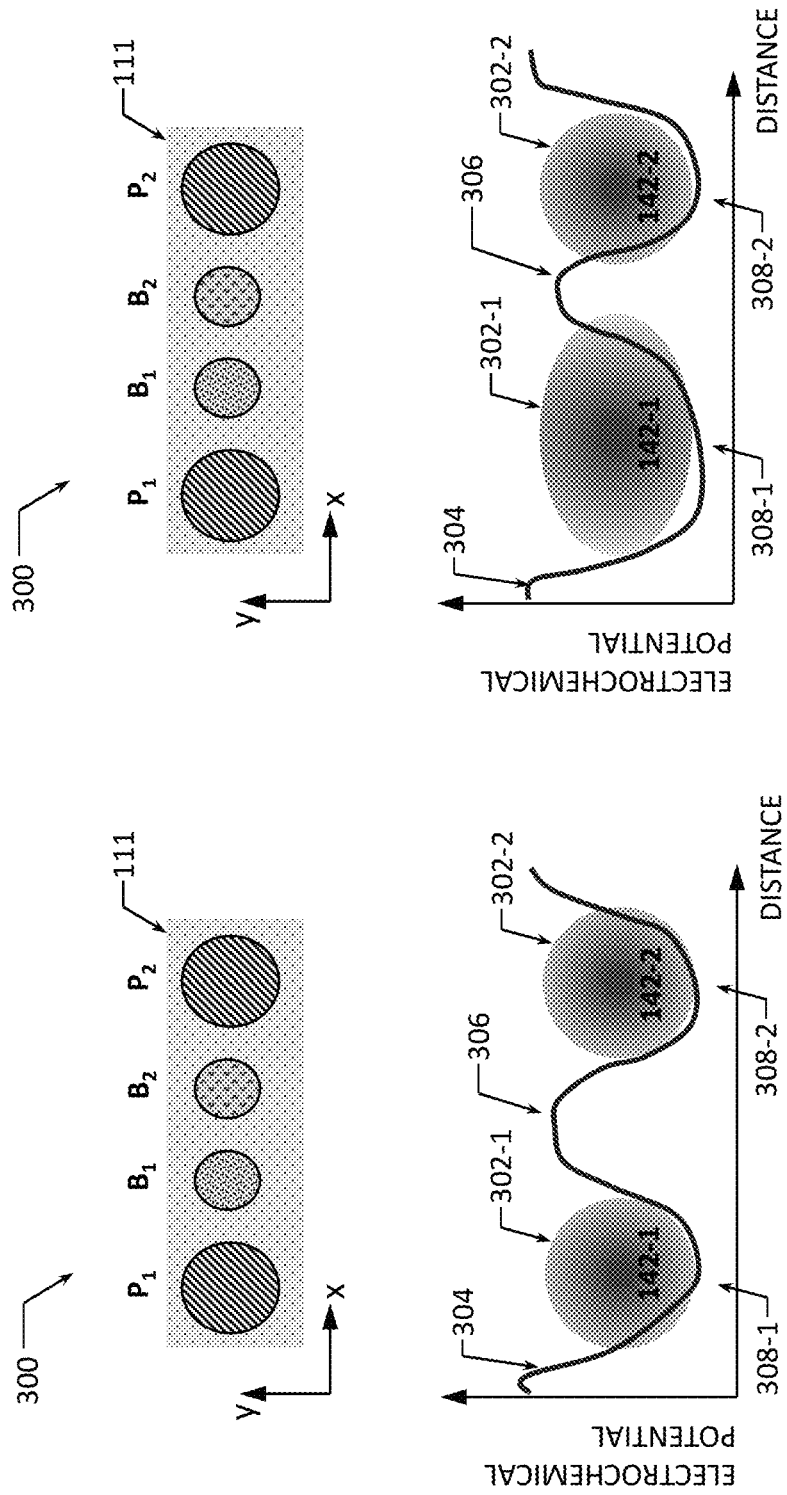

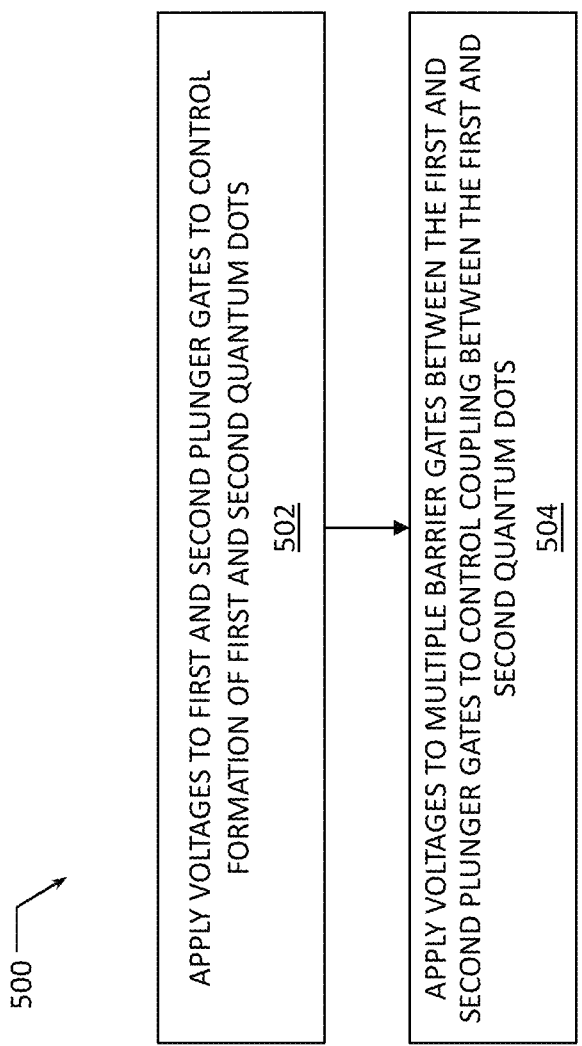

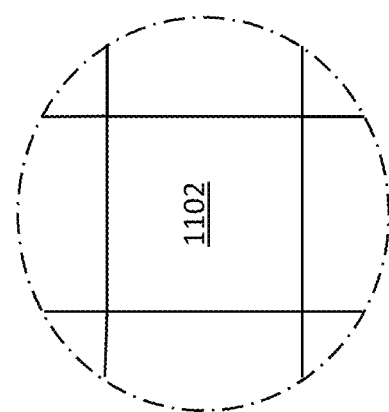
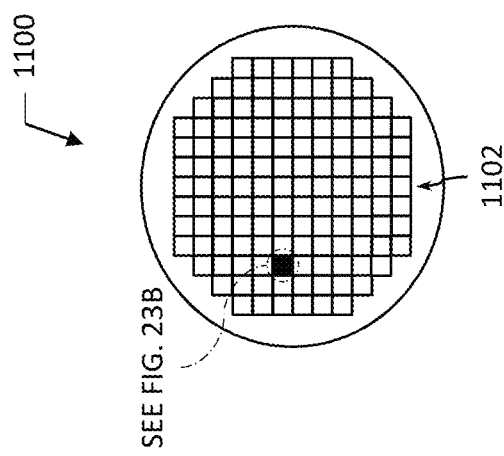
FIG. 23B
FIG. 23A

QUANTUM DOT DEVICES WITH MULTIPLE BARRIER GATES BETWEEN ADJACENT PLUNGER GATES

BACKGROUND

Quantum computing refers to the field of research related to computation systems that use quantum-mechanical phenomena to manipulate data. These quantum-mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 13-19 illustrate example base/fin arrangements that may be used in a quantum dot device with fins, in accordance with various embodiments.

FIG. 20A-20D illustrate effects of applying voltages to different gates of a gate arrangement with multiple barrier gates between adjacent plunger gates, in accordance with some embodiments.

FIG. 22 is a flow diagram of an example method of operating a quantum dot device with multiple barrier gates between adjacent plunger gates, in accordance with some embodiments.

FIGS. 23A and 23B are top-down views of a wafer and dies that may include one or more of quantum dot devices disclosed herein.

DETAILED DESCRIPTION

Overview

Figure 1:
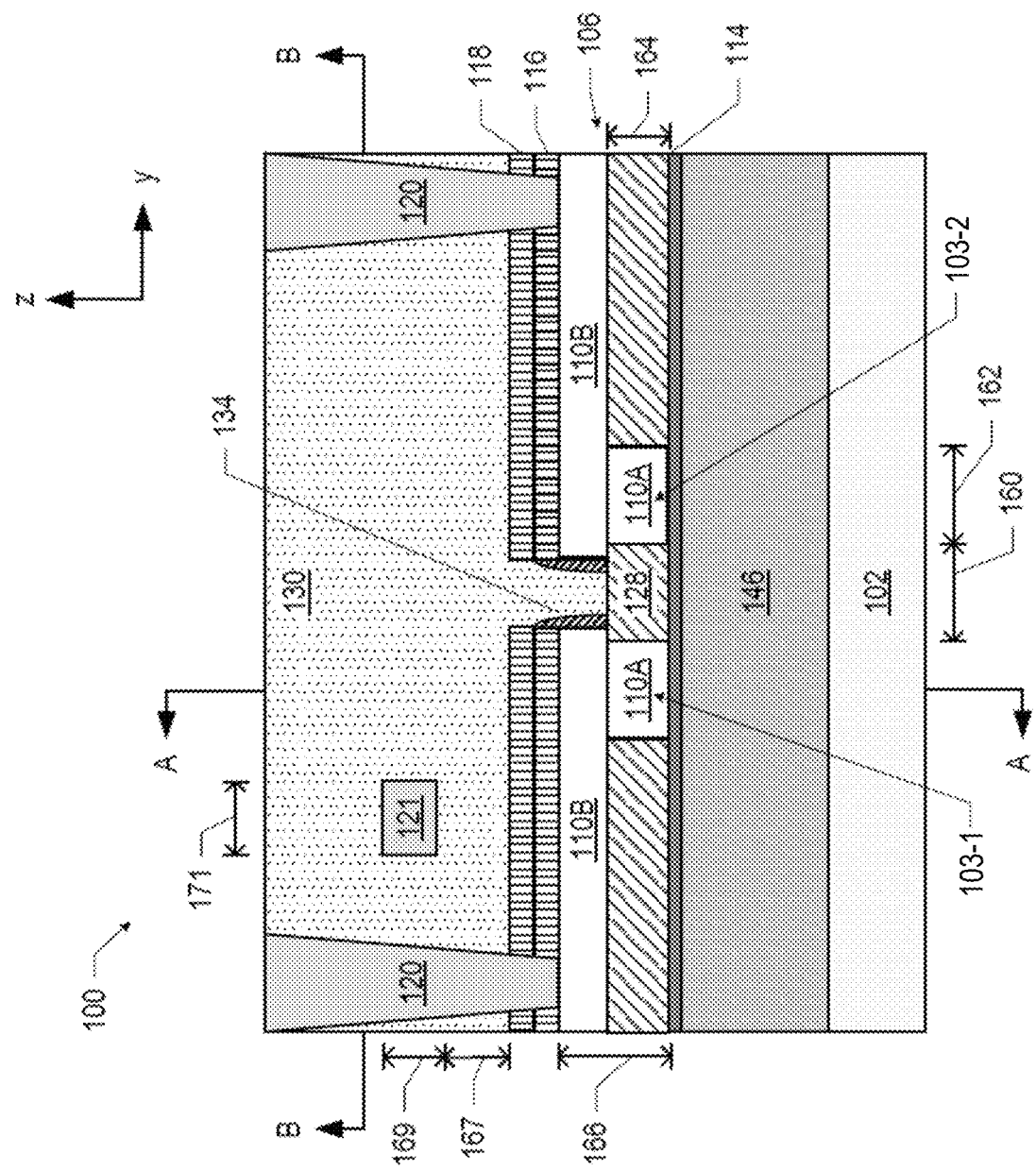
FIGS. 1-4 are cross-sectional and top-down views of an example quantum dot device with trenches, in accordance with various embodiments.

The systems, methods and devices of this disclosure each have several innovative aspects, no single one of which is solely responsible for all the desirable attributes disclosed herein. Details of one or more implementations of the subject matter described in this specification are set forth in the description below and the accompanying drawings.

For purposes of illustrating quantum dot devices with multiple barrier gates between adjacent plunger gates, proposed herein, it might be useful to first understand phenomena that may come into play in quantum computing systems. The following foundational information may be viewed as a basis from which the present disclosure may be properly explained. Such information is offered for purposes of explanation only and, accordingly, should not be construed in any way to limit the broad scope of the present disclosure and its potential applications.

As briefly described above, quantum computing, or quantum information processing, refers to the field of research related to computation systems that use quantum-mechanical phenomena to store and manipulate data. Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum-mechanical phenomenon. The principle of quantum superposition asserts that any two or more quantum states can be added together, i.e., superposed, to produce another valid quantum state, and that any quantum state can be represented as a sum of two or more other distinct states. Quantum entanglement is another example of a unique quantum-mechanical phenomenon. Entanglement refers to groups of particles or quantum bits being generated or made to interact in such a way that the state of one particle becomes intertwined with that of the others. Furthermore, the quantum state of each qubit cannot be described independently. Instead, the quantum state is given for the group of entangled particles as a whole. For example, two entangled qubits may be represented by a superposition of 4 quantum states, and N entangled qubits are represented by a superposition of 2 quantum states. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled. Yet another example of quantum-mechanical phenomena is sometimes described as a "collapse" because it asserts that when we observe (measure) qubits, we unavoidably change their properties in that, once observed, the qubits cease to be in a state of superposition or entanglement (i.e., by trying to ascertain anything about the particles, we collapse their state) and collapse to one of the $2^N$ quantum states.

Put simply, superposition postulates that a given qubit can be simultaneously in two states; entanglement postulates that two qubits can be related in that they are able to instantly coordinate their states irrespective of the distance between them in space and time so as to exist in a superposition of 4 states or in the case of N qubits in a superposition of $2^N$ quantum states; and collapse postulates that when one observes a qubit, one unavoidably changes the state of the qubit and its entanglement with other qubits. These unique phenomena make manipulation of data in quantum computers significantly different from that of classical computers (i.e., computers that use phenomena of classical physics).

Another challenge that is unique to quantum computers and does not arise in classical computers resides in protecting qubits from decoherence so that they can stay in their information-holding states long enough to perform the necessary calculations and read out the results. For this reason, qubits are often operated at cryogenic temperatures, typically just a few degrees Kelvin or even just a few millikelvin above absolute zero, because at cryogenic temperatures thermal energy is low enough to not cause spurious excitations, which is thought to help minimize qubit decoherence.

The foregoing illustrates that the ability to manipulate and read out quantum states, making quantum-mechanical phenomena visible and traceable, and the ability to deal with and improve on the fragility of quantum states of a qubit present unique challenges not found in classical computers. These challenges explain why so many current efforts of the industry and the academics continue to focus on a search for new and improved physical systems whose functionality could approach that expected of theoretically designed qubits. Physical systems for implementing qubits that have been explored until now include, e.g., semiconducting qubits including those that rely on formation of quantum dots (e.g., spin qubits and charge qubits), superconducting qubits (e.g., flux qubits or transmon qubits, the latter sometimes simply referred to as "transmons"), photon polarization qubits, single trapped ion qubits, etc. Devices implementing quantum dots (such devices referred to herein as "quantum dot devices") are particularly promising for large-scale qubit implementation.

In general, quantum dot devices enable formation of quantum dots to serve as quantum bits (i.e., as qubits) in a quantum computing device, as well as the control of these quantum dots to perform quantum logic operations. To that end, quantum dot devices implement multiple terminals, such as gate terminals of various types of gates as well as terminals for making electrical contact with doped regions of a semiconductor material (which may be referred to as "source terminals" and "drain terminals"). DC bias control signals and alternating current (AC) pulses applied to various terminals may be used to control formation of quantum dots in such devices. Detectors such as single electron transistor (SET) detectors, provided proximate to quantum dot qubits, may then be used to detect states of various qubits. Various types of gates typically included in quantum dot devices include plunger gates, barrier gates, and accumulation gates. Plunger gates are gates used to enable formation of quantum dots in a quantum well stack below these gates. Barrier gates are gates used to adjust the potential barrier between quantum dots formed under adjacent plunger gates. Accumulation gates are gates used to control reservoirs of charge carriers for in quantum dot devices. Typically, quantum dot devices include a first row of a quantum dot formation region (i.e., a row in which quantum dots may be formed) for forming quantum dots of various qubits, and a second row of a quantum dot formation region for forming quantum dots that are a part of a SET detector corresponding to the qubits of the first row. For example, in some implementations, a single SET based on quantum dots formed along the second row is used to detect states of the quantum dots of multiple qubits of the first row, although in other implementations multiple SETs may be used to detect states of the quantum dots of multiple qubits of the first row. In such arrangements, for each of the first and second rows, a first and a second accumulation gates may be provided over the opposite ends of the row, adjacent and electrically coupled to (e.g., in contact with), respectively, a first and a second doped regions of the row. One of the first and second doped regions serves as a source region and the other one serves as a drain region. Plunger and barrier gates may be provided between the first and second accumulation gates. Plunger and barrier gates may be arranged in alternation. More specifically, in conventional implementations, a single barrier gate is provided between a pair of adjacent plunger gates. In contrast to such conventional implementations, quantum dot devices disclosed herein include multiple (i.e., two or more) barrier gates between at least some (or all) of adjacent plunger gates. As used herein, reference to multiple barrier gates between adjacent plunger gates implies that two or more barrier gates are arranged spatially between a first plunger gate and a second plunger gate, where the first and second plunger gates are "adjacent" in that there are no other plunger gates present between them. In such devices, multiple barrier gates between two adjacent plunger gates are coupled to respective (i.e., individual) signal sources (e.g., voltage sources) and may be individually controlled by signals (e.g., microwave pulses) being applied to one or more of the multiple barrier gates to control electrostatics so that the potential barrier between quantum dots formed under adjacent plunger gates may be adjusted. In particular, such quantum dot devices may be configured so that in order to couple a quantum dot formed under one of the adjacent plunger gates with a quantum dot formed under the other one of the adjacent plunger gates appropriate signals should be applied to two or more of the multiple barrier gates between these adjacent plunger gates, and that application of signals to only one of the barrier gates would not result in sufficient coupling of quantum dots (i.e., the quantum dots remain to be sufficiently isolated from one another). In other words, in such quantum dot devices, appropriate signals are to be applied to two or more of the multiple barrier gates between a pair of adjacent plunger gates in order to realize sufficient coupling of quantum dots. Unlike previous approaches to quantum dot formation and manipulation, various embodiments of the quantum dot devices disclosed herein provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices. In particular, by implementing multiple barrier gates between at least some of adjacent plunger gates of a quantum dot device in a manner that allows independent control of the multiple barrier gates, great flexibility over qubit control and readout may be achieved and crossbar wiring schemes with individual control may become possible. Implementing multiple barrier gates between at least some of adjacent plunger gates may be particularly advantageous for two-qubit gates with single-dot qubits or exchange-only qubits.

In various embodiments, quantum dot devices with multiple barrier gates between adjacent plunger gates as described herein may be implemented as components associated with a quantum integrated circuit (IC). Such components may include those that are mounted on or embedded in a quantum IC, or those connected to a quantum IC. The quantum IC may be either analog or digital and may be used in a number of applications within or associated with quantum systems, such as e.g., quantum processors, quantum amplifiers, quantum sensors, etc., depending on the components associated with the IC. The IC may be employed as part of a chipset for executing one or more related functions in a quantum system.

In order to provide substantially lossless connectivity to, from, and between the qubits, some or all of the electrically conductive portions of quantum circuit assemblies described herein, in particular various gates and conductive vias described herein, as well as other components of quantum circuits, may be made from one or more superconductive materials. However, some or all of these electrically conductive portions could be made from electrically conductive materials which are not superconductive. In the following, unless specified otherwise, reference to an electrically conductive material implies that a superconductive material can be used, and vice versa. Furthermore, materials described herein as "superconductive/superconducting materials" may refer to materials, including alloys of materials, that exhibit superconducting behavior at typical qubit operating conditions (e.g., materials which exhibit superconducting behavior at very low temperatures at which qubits typically operate), but which may or may not exhibit such behavior at higher temperatures (e.g., at room temperatures). Examples of such materials include aluminum (Al), niobium (Nb), niobium nitride (NbN), titanium nitride (TiN), niobium titanium nitride (NbTiN), indium (In), and molybdenum rhenium (MoRe), all of which are particular types of superconductors at qubit operating temperatures, as well as their alloys.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, such as e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

In the following detailed description, various aspects of the illustrative implementations will be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc.; the term "high-k dielectric" refers to a material having a higher dielectric constant than silicon oxide; the term "low-k dielectric" refers to a material having a lower dielectric constant than silicon oxide. The term "insulating" means "electrically insulating," the term "conducting" means "electrically conducting," unless otherwise specified. Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. A first component described to be electrically coupled to a second component means that the first component is in conductive contact with the second component (i.e., that a conductive pathway is provided to route electrical signals/power between the first and second components). As used herein, a "magnet line" refers to a magnetic field-generating structure to influence (e.g., change, reset, scramble, or set) the spin states of quantum dots. One example of a magnet line, as discussed herein, is a conductive pathway that is proximate to an area of quantum dot formation and selectively conductive of a current pulse that generates a magnetic field to influence a spin state of a quantum dot in the area.

Furthermore, as used herein, terms indicating what may be considered an idealized behavior, such as e.g., "lossless" (or "low-loss") or "superconductive/superconducting," are intended to cover functionality that may not be exactly ideal but is within acceptable margins for a given application. For example, a certain level of loss, either in terms of nonzero electrical resistance or nonzero amount of spurious two-level systems (TLSs) may be acceptable such that the resulting materials and structures may still be referred to by these "idealized" terms. Specific values associated with an acceptable level of loss are expected to change over time as fabrication precision will improve and as fault-tolerant schemes may become more tolerant of higher losses, all of which are within the scope of the present disclosure.

For the purposes of the present disclosure, the phrase "A and/or B" means (A), (B), or (A and B), while the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C). The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "over," "under," "between," and "on" as used herein refer to a relative spatial position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Quantum Dot Formation Regions of Quantum Dot Devices

Quantum dot devices enable formation of quantum dots to serve as quantum bits (i.e., as qubits) in a quantum computing device, as well as formation of quantum dots to serve as a part of one or more SETs for reading/detecting states of said qubits. In particular, quantum dot devices described herein include rows of quantum dot formation regions—at least one row being a row of a quantum dot formation region where quantum dots for serving as qubits are formed, and at least one other row being a row of a quantum dot formation region where quantum dots for serving as a part of one or more SETs are formed.

In various embodiments, rows of quantum dot formation regions may be formed in different manners. In a first embodiment (where a quantum dot device may be referred to as a trench-based device), a row of a quantum dot formation region may be defined by an insulating material provided over a continuous quantum well stack, the insulating material including a trench corresponding to the row (i.e., multiple trenches if there are multiple rows of quantum dot formation regions), the trench extending toward the continuous quantum well stack, and portions of gate metals of different gates being at least partially in the trench. In such an embodiment, even though the quantum well stack is continuous along a portion of a plane, i.e., continuous in a two-dimensional plane, confinement of the quantum dot formation region to a row (i.e., confinement of the quantum dots formed in a region that is a row), i.e., confinement to substantially one direction, is achieved by the confinement to substantially one direction of the trench in the insulating material, the trench at least partially filled with one or more gate metals. Such embodiments are described below with reference to FIGS. 1-4. In a second embodiment (where a quantum dot device may be referred to as a fin-based device), a row of a quantum dot formation region may be defined by at least a portion of a quantum well stack being formed as a fin corresponding to the row (i.e., multiple fins if there are multiple rows of quantum dot formation regions), and portions of gate metals of different gates being over the fin. In such an embodiment, confinement of the quantum dot formation region to a row is achieved by the confining the quantum well stack to the fin. Thus, in contrast to the second embodiment, at least portions of the quantum well stack may not be horizontally continuous across different fins. Such embodiments are described below with reference to FIGS. 10-12. In various embodiments, the quantum dot devices disclosed herein may provide two-dimensional arrays of quantum dots (e.g., quantum dots 142) during operation, with the quantum dots constrained in "rows" by the quantum dot formation regions (e.g., quantum dot formation regions 111) and "columns" by the gates (e.g., gates 106/108), as discussed below. In some embodiments, individual ones of the gates (e.g., of the gates 106/108) may be shared between multiple quantum dot formation regions. Quantum dot devices that include multiple barrier gates between adjacent plunger gates for a given row of a quantum dot formation region as described herein may be implemented with said row of quantum dot formation regions defined by either one of these two embodiments. In some embodiments, multiple barrier gates between adjacent plunger gates may be implemented only for rows of quantum dot formation regions where quantum dots for serving as qubits are formed. In other embodiments, multiple barrier gates between adjacent plunger gates may be implemented only for rows of quantum dot formation regions where quantum dots for serving as a part of one or more SETs are formed. In still other embodiments, multiple barrier gates between adjacent plunger gates may be implemented for, both, one or more of the rows of quantum dot formation regions where quantum dots for serving as qubits are formed and one or more of the rows of quantum dot formation regions where quantum dots for serving as a part of one or more SETs are formed.

Example Trench-Based Quantum Dot Devices

One type of quantum dot devices includes devices having a base, a continuous quantum well layer extending over the base, an insulating material over the quantum well layer, one or more trenches in the insulating material, and one or more gates with gate metals at least partially disposed in the trenches. In such devices, the quantum well layer is not etched into fins, as in fin-based devices. A quantum dot formed in such a device may be constrained in the x-direction by the one or more gates, in the y-direction by the trench, and in the z-direction by the quantum well layer, as discussed in detail herein. Unlike previous approaches to quantum dot formation and manipulation, quantum dot devices with trenches provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices. Therefore, this type of a quantum dot device is described as a first example quantum dot device in which multiple barrier gates between adjacent plunger gates as described herein may be implemented.

Figure 2:
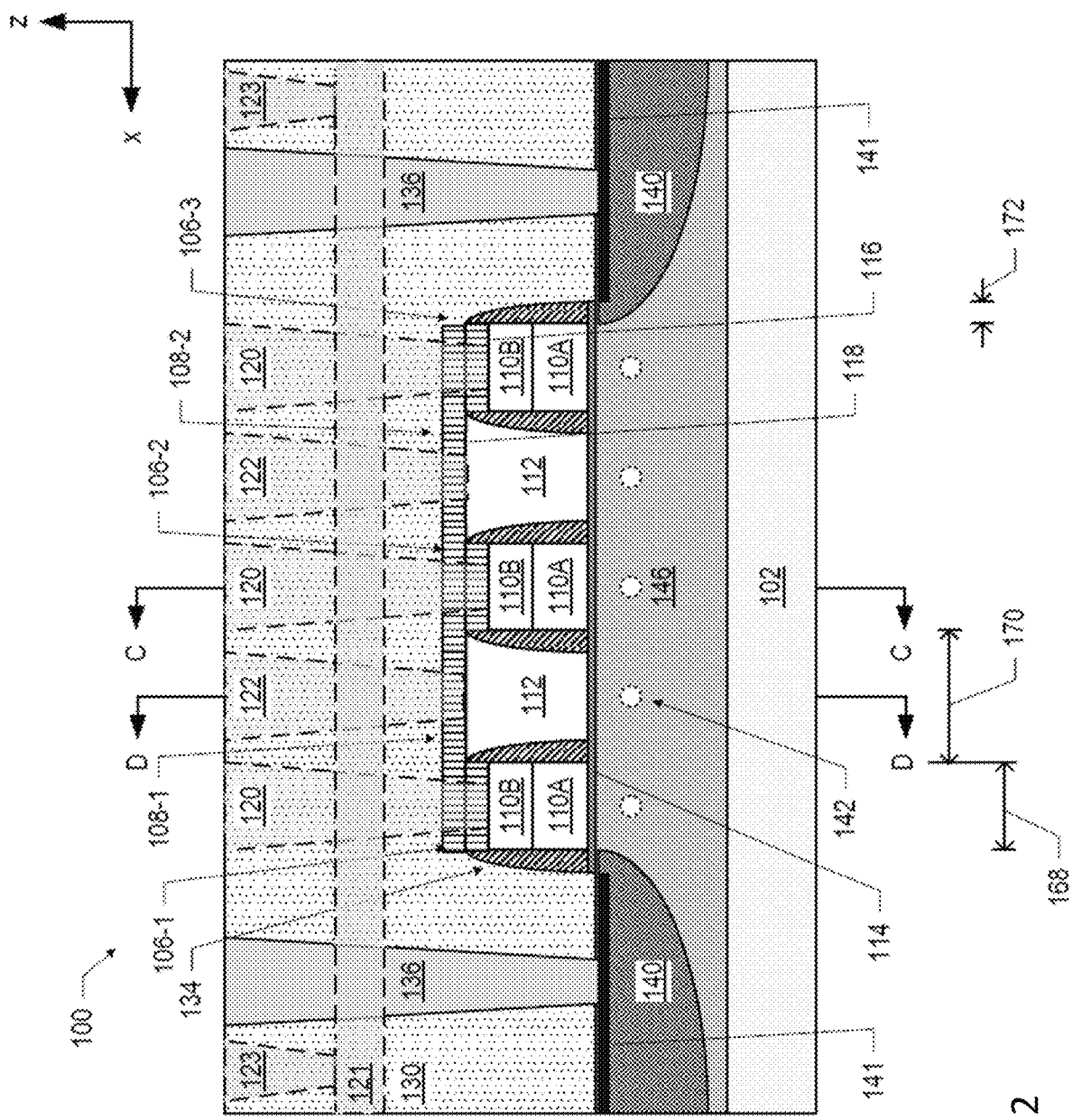
Figure 3:
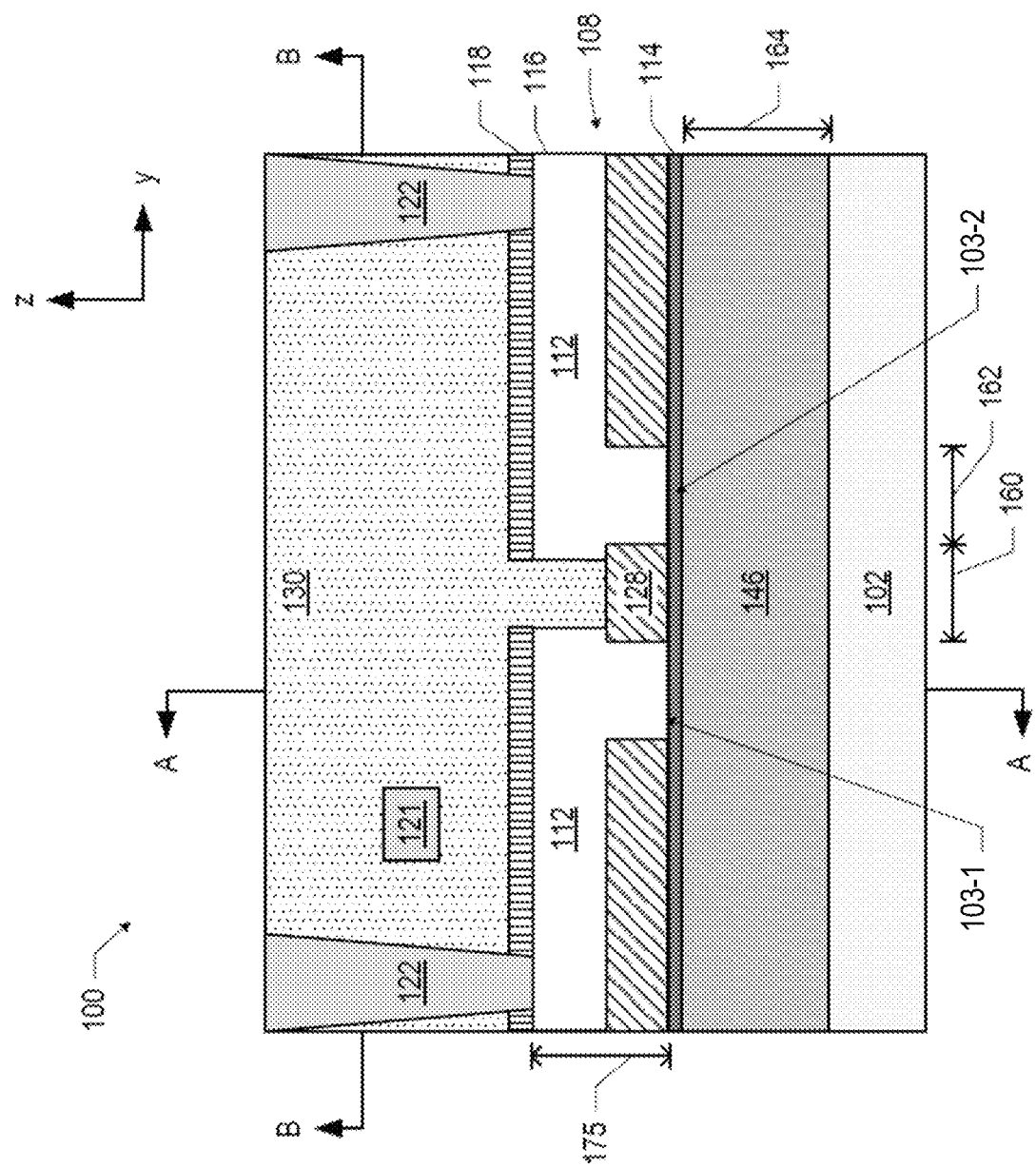
Figure 4:
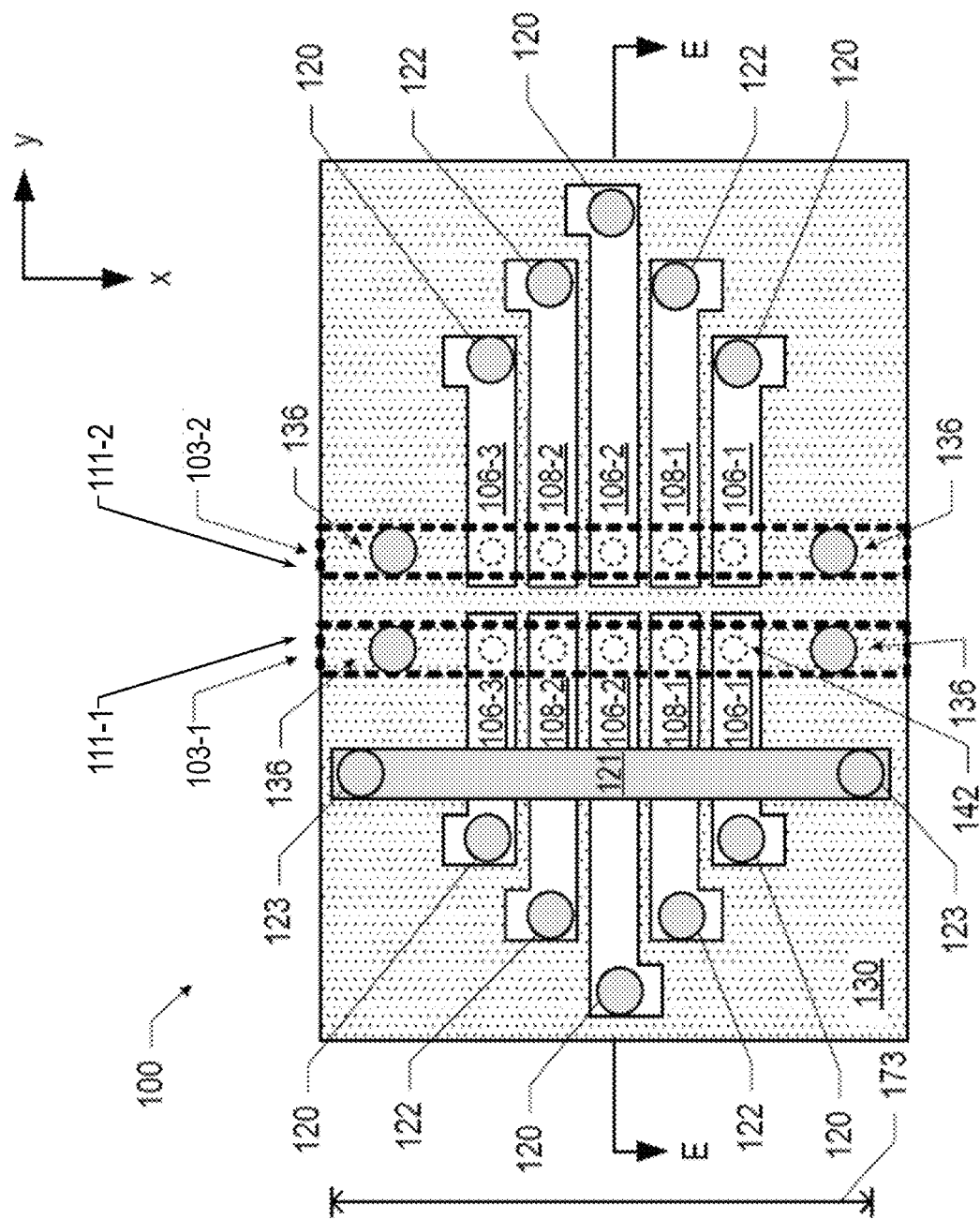

FIGS. 1-4 are cross-sectional and top-down views of a quantum dot device 100, in accordance with various embodiments. In particular, FIGS. 1-3 provide cross-sectional views of the quantum dot device 100, where FIG. 2 illustrates the quantum dot device 100 taken along the section A-A of FIG. 1 (while FIG. 1 illustrates the quantum dot device 100 taken along the section C-C of FIG. 2) and FIG. 3 illustrates the quantum dot device 100 taken along the section D-D of FIG. 2 (while FIG. 2 illustrates the quantum dot device 100 taken along the section A-A of FIG. 3), while FIG. 4 illustrates a top-down view of the quantum dot device 100 (i.e., a view taken along the section B-B of FIG. 1 with a number of components not shown to more readily illustrate how the gates 106/108 and the magnet line 121 may be patterned). FIG. 1 illustrates the quantum dot device 100 taken along the section E-E of FIG. 4. Although FIG. 1 indicates that the cross-section illustrated in FIG. 2 is taken through the trench 103-1, an analogous cross-section taken through the trench 103-2 may be identical, and thus the discussion of FIG. 2 refers generally to the "trench 103."

The quantum dot device 100 may include a quantum well stack 146 disposed on a base 102. An insulating material 128 may be disposed above the quantum well stack 146, and multiple trenches 103 in the insulating material 128 may extend toward the quantum well stack 146. In the embodiment illustrated in FIGS. 1-4, a gate dielectric 114 may be disposed between the quantum well stack 146 and the insulating material 128 so as to provide the "bottom" of the trenches 103. A number of examples of quantum well stacks 146 are discussed below with reference to FIGS. 5-7.

Although only two trenches, 103-1 and 103-2, are shown in FIGS. 1-4, this is simply for ease of illustration, and more than two trenches 103 may be included in the quantum dot device 100. In some embodiments, the total number of trenches 103 included in the quantum dot device 100 is an even number, with the trenches 103 organized into pairs including one active trench 103 and one read trench 103, as discussed in detail below. When the quantum dot device 100 includes more than two trenches 103, the trenches 103 may be arranged in pairs in a line (e.g., 2N trenches total may be arranged in a 1×2N line, or a 2×N line) or in pairs in a larger array (e.g., 2N trenches total may be arranged as a 4×N/2 array, a 6×N/3 array, etc.). As illustrated in FIGS. 1, 3, and 4, in some embodiments, multiple trenches 103 may be oriented substantially in parallel. The discussion herein will largely focus on a single pair of trenches 103 for ease of illustration, but all the teachings of the present disclosure apply to quantum dot devices 100 with more trenches 103. Further, the use of the term "trench" should not be interpreted to require that the insulating material 128 is deposited first and then a portion of that insulating material 128 is excavated to form the trench 103 prior to depositing material in the trench 103; in various embodiments, the insulating material 128 may be deposited before or after deposition of the material that will ultimately be disposed in the trench 103.

The quantum dot device 100 of FIGS. 1-4 may include multiple quantum dot formation regions 111 (labeled in FIG. 4), defined by the parallel trenches 103 in the insulating material 128 disposed on top of the quantum well stack 146. These quantum dot formation regions 111 may be portions of the quantum well stack 146 in which quantum dots 142 may form during operation. Only one quantum dot 142 is labeled with a reference numeral in FIGS. 2 and 4 for ease of illustration, but five are indicated as dotted circles below each trench 103. The quantum dot formation regions 111 may be arranged as multiple parallel rows defined by the trenches 103, and the gates 106/108 may each extend over multiple ones of the quantum dot formation regions 111.

The quantum well stack 146 may include a quantum well layer (not shown in FIGS. 1-4 but discussed below with reference to the quantum well layer 152 of FIGS. 5-7). The quantum well layer included in the quantum well stack 146 may be arranged normal to the z-direction, and may provide a layer in which a two-dimensional electron gas (2DEG) or a two-dimensional hole gas (2DHG) may form to enable the generation of one or more quantum dots during operation of the quantum dot device 100, as discussed in further detail below. The quantum well layer itself may provide a geometric constraint on the z-location of quantum dots in the quantum well stack 146. To control the x- and y-location of quantum dots in the quantum well stack 146, voltages may be applied to gates disposed at least partially in the trenches 103 above the quantum well stack 146 to adjust the energy profile along the trenches 103 in the x- and y-direction and thereby constrain the x- and y-location of quantum dots within quantum wells (discussed in detail below with reference to the gates 106/108). The dimensions of the trenches 103 may take any suitable values. For example, in some embodiments, the trenches 103 may each have a width 162 between about 5 nanometers and 50 nanometers. In some embodiments, the trenches 103 may each have a depth 164 between about 40 nanometers and 400 nanometers (e.g., between about 50 nanometers and 350 nanometers, or equal to about 100 nanometers). The insulating material 128 may be a dielectric material (e.g., an interlayer dielectric), such as silicon oxide. In some embodiments, the insulating material 128 may be a chemical vapor deposition (CVD) or flowable CVD oxide. In some embodiments, the trenches 103 may be spaced apart by a distance 160 between about 30 nanometers and 300 nanometers.

Multiple gates may be disposed at least partially in each of the trenches 103. In the embodiment illustrated in FIG. 2, three gates 106 and two gates 108 are shown as distributed at least partially in a single trench 103. Out of the gates 106/108, some gates may be plunger gates and some gates may be barrier gates. In particular, the division between the plunger and the barrier gates among the gates 106/108 may be such as to provide multiple gates between adjacent plunger gates in the quantum dot device 100. For example, the gates 106-1 and 106-3 may be used as first and second plunger gates to enable the formation of quantum dots 142 under the gates 106-1 and 106-3, while the gates 108-1, 106-2, and 108-2 may be used as multiple (three, in this example) barrier gates to adjust the potential barrier between quantum dots 142 formed under the gates 106-1 and 106-3. This particular number of gates is simply illustrative, and any suitable number of gates may be used (in fact, each of FIG. 20 and FIG. 21, showing various embodiments of quantum dot devices with multiple barrier gates between adjacent plunger gates illustrates different total numbers of plunger and barrier gates). Additionally, in some embodiments, multiple groups of gates (like the gates illustrated in FIG. 2) may be disposed at least partially in the trench 103. Although FIG. 2 and FIG. 4 illustrate the quantum dots 142 under each of the gates 106/108 shown, this is only to illustrate that, in principle, when any suitable number of these gates is implemented in the quantum dot device 100, any of the gates 106/108 may be used as plunger gates and the rest of the gates 106/108 may be used as barrier gates, but, once the designation of plunger and barrier gates is made, the quantum dots 142 would only form under those of the gates 106/108 that are designated to serve as plunger gates.

As shown in FIG. 2, the gate 108-1 may be disposed between the gates 106-1 and 106-2, and the gate 108-2 may be disposed between the gates 106-2 and 106-3. Each of the gates 106/108 may include a gate dielectric 114; in the embodiment illustrated in FIG. 2, the gate dielectric 114 for all of the gates 106/108 is provided by a common layer of gate dielectric material disposed between the quantum well stack 146 and the insulating material 128. In other embodiments, the gate dielectric 114 for each of the gates 106/108 may be provided by separate portions of gate dielectric 114 (i.e., the gate dielectric 114 may not be continuous across multiple ones of the gates 106/108). In some embodiments, the gate dielectric 114 may be a multilayer gate dielectric (e.g., with multiple materials used to improve the interface between the trench 103 and the corresponding gate metal). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114.

Each of the gates 106 may include a gate metal 110 (including multiple layers of gate metal) and a hardmask 116. In particular, a first gate metal layer 110A may be disposed in the trench 103, and a second gate metal layer 110B may be disposed above the gate metal 110-1 and above the insulating material 128, as shown. The hardmask 116 may be formed of silicon nitride, silicon carbide, or another suitable material. The gate metal 110 may be disposed between the hardmask 116 and the gate dielectric 114, and the gate dielectric 114 may be disposed between the gate metal 110 and the quantum well stack 146. As shown in FIG. 1, in some embodiments, the gate metal 110 of a gate 106 may extend over the insulating material 128 and into a trench 103 in the insulating material 128. Only one portion of the hardmask 116 is labeled in FIG. 2 for ease of illustration.

In some embodiments, the gate metal 110 may be a superconductor, such as aluminum, titanium nitride, or niobium titanium nitride; any of these materials may be included in the first gate metal layer 110A and/or the second gate metal layer 110B. In some embodiments, the first gate metal layer 110A may have a different material composition than the second gate metal layer 110B. For example, the first gate metal layer 110A may be titanium nitride, while the second gate metal layer 110B may be a material different from titanium nitride, or vice versa. In some embodiments, the first gate metal layer 110A and the second gate metal layer 110B may have the same material composition but a different microstructure. These different microstructures may arise, for example, by different deposition and/or patterning techniques used to form the first gate metal layer 110A and the second gate metal layer 110B. For example, in some embodiments, the first gate metal layer 110A may have a microstructure including columnar grains (e.g., when the first gate metal layer 110A is initially blanket-deposited and then etched as part of a subtractive patterning process), while the second gate metal layer 110B may not exhibit a columnar grain structure. In some embodiments, a seam delineating the interface between the top surface of the first gate metal layer 110A and the bottom surface of the second gate metal layer 110B may be present in the quantum dot device 100.

In some embodiments, the hardmask 116 may not be present in the quantum dot device 100 (e.g., a hardmask like the hardmask 116 may be removed during processing). The sides of the gate metal 110 may be substantially parallel, as shown in FIG. 2, and insulating spacers 134 may be disposed on the sides of the gate metal 110 and the hardmask 116 along the longitudinal axis of the trench 103. As illustrated in FIG. 2, the spacers 134 may be thicker closer to the quantum well stack 146 and thinner farther away from the quantum well stack 146. In some embodiments, the spacers 134 may have a convex shape. The spacers 134 may be formed of any suitable material, such as a carbon-doped oxide, silicon nitride, silicon oxide, or other carbides or nitrides (e.g., silicon carbide, silicon nitride doped with carbon, and silicon oxynitride). As illustrated in FIG. 1, no spacer material may be disposed between the gate metal 110 and the sidewalls of the trench 103 in the y-direction.

Each of the gates 108 may include a gate metal 112 and a hardmask 118. The hardmask 118 may be formed of silicon nitride, silicon carbide, or another suitable material. The gate metal 112 may be disposed between the hardmask 118 and the gate dielectric 114, and the gate dielectric 114 may be disposed between the gate metal 112 and the quantum well stack 146. As shown in FIG. 3, in some embodiments, the gate metal 112 of a gate 108 may extend over the insulating material 128 and into a trench 103 in the insulating material 128. In the embodiment illustrated in FIG. 2, the hardmask 118 may extend over the hardmask 116 (and over the gate metal 110 of the gates 106), while in other embodiments, the hardmask 118 may not extend over the gate metal 110. In the embodiment of FIGS. 1-3, the gate metal 112 of the gates 108 may be provided by a single continuous layer of material (and may not, for example, include multiple different layers of gate metal, as was discussed above with reference to the gate metal 110 of the gates 106). In other embodiments, however, the gate metal 112 of the gates 108 may include multiple layers of gate metal, e.g., multiple layers similar to the first gate metal layer 110A and the second gate metal layer 110B. In some embodiments, the gate metal 112 may be a different metal from the first gate metal layer 110A and/or the second gate metal layer 110B; in other embodiments, the gate metal 112 and the first gate metal layer 110A and/or the second gate metal layer 110B may have the same material composition. In some embodiments, the gate metal 112 may be a superconductor, such as aluminum, titanium nitride, or niobium titanium nitride. In some embodiments, the hardmask 118 may not be present in the quantum dot device 100 (e.g., a hardmask like the hardmask 118 may be removed during processing).

The gate 108-1 may extend between the proximate spacers 134 on the sides of the gate 106-1 and the gate 106-2 along the longitudinal axis of the trench 103, as shown in FIG. 2. In some embodiments, the gate metal 112 of the gate 108-1 may extend between the spacers 134 on the sides of the gate 106-1 and the gate 106-2 along the longitudinal axis of the trench 103. Thus, the gate metal 112 of the gate 108-1 may have a shape that is substantially complementary to the shape of the spacers 134, as shown in FIG. 2. Similarly, the gate 108-2 may extend between the proximate spacers 134 on the sides of the gate 106-2 and the gate 106-3 along the longitudinal axis of the trench 103. In some embodiments in which the gate dielectric 114 is not a layer shared commonly between the gates 108 and 106, but instead is separately deposited in the trench 103 between the spacers 134, the gate dielectric 114 may extend at least partially up the sides of the spacers 134 (and up the proximate sidewalls of the trench 103), and the gate metal 112 may extend between the portions of gate dielectric 114 on the spacers 134 (and the proximate sidewalls of the trench 103). As illustrated in FIG. 3, in some embodiments, no spacer material may be disposed between the gate metal 112 and the sidewalls of the trench 103 in the y-direction; in other embodiments (not shown in the present drawings), spacers 134 may also be disposed between the gate metal 112 and the sidewalls of the trench 103 in the y-direction.

The dimensions of the gates 106/108 may take any suitable values. For example, in some embodiments, the z-height 166 of the gate metal 110 in the trench 103 may be between about 100 nanometers and 400 nanometers (e.g., approximately about 200 nanometers); the z-height 175 of the gate metal 112 may be in about the same range. This z-height 166 of the gate metal 110 in the trench 103 may represent the sum of the z-height of the first gate metal layer 110A (e.g., between about 40 nanometers and 300 nanometers) and the thickness of the second gate metal layer 110B (e.g., between about 25 nanometers and 100 nanometers, or approximately 50 nanometers). In embodiments like the ones illustrated in FIGS. 1-3, the z-height 175 of the gate metal 112 may be greater than the z-height 166 of the gate metal 110 (as can be seen in, e.g., FIG. 2). In some embodiments, the length 168 of the gate metal 110 (i.e., in the x-direction) may be between about 20 nanometers and 50 nanometers (e.g., about 30 nanometers). Although all of the gates 106 are illustrated in the accompanying drawings as having the same length 168 of the gate metal 110, in some embodiments, the "outermost" gates 106 (e.g., the gates 106-1 and 106-3 of the embodiment illustrated in FIG. 2) may have a greater length 168 than the "inner" gates 106 (e.g., the gate 106-2 in the embodiment illustrated in FIG. 2). Such longer "outside" gates 106 may provide spatial separation between the doped regions 140 and the areas under the gates 108 and the inner gates 106 in which quantum dots 142 may form, and thus may reduce the perturbations to the potential energy landscape under the gates 108 and the inner gates 106 caused by the doped regions 140.

In some embodiments, the distance 170 between adjacent ones of the gates 106 (e.g., as measured from the gate metal 110 of one gate 106 to the gate metal 110 of an adjacent gate 106 in the x-direction, as illustrated in FIG. 2) may be between about 40 nanometers and 100 nanometers (e.g., about 50 nanometers). In some embodiments, the thickness 172 of the spacers 134 may be between about 1 nanometer and 10 nanometers (e.g., between about 3 nanometers and 5 nanometers, between about 4 nanometers and 6 nanometers, or between about 4 nanometers and 7 nanometers). The length of the gate metal 112 (i.e., in the x-direction) may depend on the dimensions of the gates 106 and the spacers 134, as illustrated in FIG. 2. As indicated in FIGS. 1 and 3, the gates 106/108 in one trench 103 may extend over the insulating material 128 between that trench 103 and an adjacent trench 103, but may be isolated from their counterpart gates by the intervening insulating material 130 and spacers 134.

As shown in FIG. 2, the gates 106 and 108 may be alternatingly arranged in the x-direction. During operation of the quantum dot device 100, voltages may be applied to the gates 106/108 to adjust the potential energy in the quantum well stack 146 to create quantum wells of varying depths in which quantum dots 142 may form. The location of the quantum dots 142 in FIGS. 2 and 4 is not intended to indicate a particular geometric positioning of the quantum dots 142. The spacers 134 (and the insulating material 128) may themselves provide "passive" barriers between quantum dots under the gates 106/108 in the quantum well stack 146, and the voltages applied to different ones of the gates 106/108 may adjust the potential energy under the gates 106/108 in the quantum well stack 146; decreasing the potential energy under a gate 106/108 may enable the formation of a quantum dot under that gate 106/108, while increasing the potential energy under a gate 106/108 may form a quantum barrier under that gate 106/108.

The quantum well stack 146 may include doped regions 140 that may serve as a reservoir of charge carriers for the quantum dot device 100. For example, an n-type doped region 140 may supply electrons for electron-type quantum dots 142, and a p-type doped region 140 may supply holes for hole-type quantum dots 142. In some embodiments, an interface material 141 may be disposed at a surface of a doped region 140, as shown. The interface material 141 may facilitate electrical coupling between a conductive contact (e.g., a conductive via 136, as discussed below) and the doped region 140. The interface material 141 may be any suitable metal-semiconductor ohmic contact material; for example, in embodiments in which the doped region 140 includes silicon, the interface material 141 may include nickel silicide, aluminum silicide, titanium silicide, molybdenum silicide, cobalt silicide, tungsten silicide, or platinum silicide. In some embodiments, the interface material 141 may be a non-silicide compound, such as titanium nitride. In some embodiments, the interface material 141 may be a metal (e.g., aluminum, tungsten, or indium).

The quantum dot devices 100 disclosed herein may be used to form electron-type or hole-type quantum dots 142. Note that the polarity of the voltages applied to the gates 106/108 to form quantum wells/barriers depends on the charge carriers used in the quantum dot device 100. In embodiments in which the charge carriers are electrons (and thus the quantum dots 142 are electron-type quantum dots), amply negative voltages applied to a gate 106/108 may increase the potential barrier under the gate 106/108, and amply positive voltages applied to a gate 106/108 may decrease the potential barrier under the gate 106/108 (thereby forming a potential well in which an electron-type quantum dot 142 may form). In embodiments in which the charge carriers are holes (and thus the quantum dots 142 are hole-type quantum dots), amply positive voltages applied to a gate 106/108 may increase the potential barrier under the gate 106/108, and amply negative voltages applied to a gate 106 and 108 may decrease the potential barrier under the gate 106/108 (thereby forming a potential well in which a hole-type quantum dot 142 may form). The quantum dot devices 100 disclosed herein may be used to form electron-type or hole-type quantum dots.

Voltages may be applied to each of the gates 106 and 108 separately to adjust the potential energy in the quantum well stack 146 under the gates 106 and 108, and thereby control the formation of quantum dots 142 under each of the gates 106 and 108. Additionally, the relative potential energy profiles under different ones of the gates 106 and 108 allow the quantum dot device 100 to tune the potential interaction between quantum dots 142 under adjacent gates. For example, if two adjacent quantum dots 142 (e.g., one quantum dot 142 under a gate 106 and another quantum dot 142 under an adjacent gate 108) are separated by only a short potential barrier, the two quantum dots 142 may interact more strongly than if they were separated by a taller potential barrier. Since the depth of the potential wells/height of the potential barriers under each gate 106/108 may be adjusted by adjusting the voltages on the respective gates 106/108, the differences in potential between adjacent gates 106/108 may be adjusted, and thus the interaction tuned.

Conductive vias and lines may make contact with the gates 106/108, and to the doped regions 140, to enable electrical connection to the gates 106/108 and the doped regions 140 to be made in desired locations. As shown in FIGS. 1-4, the gates 106 may extend both "vertically" and "horizontally" away from the quantum well stack 146, and conductive vias 120 may contact the gates 106 (and are drawn in dashed lines in FIG. 2 to indicate their location behind the plane of the drawing). The conductive vias 120 may extend through the hardmask 116 and the hardmask 118 to contact the gate metal 110 of the gates 106. The gates 108 may similarly extend away from the quantum well stack 146, and conductive vias 122 may contact the gates 108 (also drawn in dashed lines in FIG. 2 to indicate their location behind the plane of the drawing). The conductive vias 122 may extend through the hardmask 118 to contact the gate metal 112 of the gates 108. Conductive vias 136 may contact the interface material 141 and may thereby make electrical contact with the doped regions 140. The quantum dot device 100 may include further conductive vias and/or lines (not shown) to make electrical contact to the gates 106/108 and/or the doped regions 140, as desired. The conductive vias and lines included in a quantum dot device 100 may include any suitable materials, such as copper, tungsten (deposited, e.g., by CVD), or a superconductor (e.g., aluminum, tin, titanium nitride, niobium titanium nitride, tantalum, niobium, or other niobium compounds such as niobium tin and niobium germanium).

During operation, a bias voltage may be applied to the doped regions 140 (e.g., via the conductive vias 136 and the interface material 141) to cause current to flow through the doped regions 140 and through a quantum well layer of the quantum well stack 146 (discussed in further detail below with reference to FIGS. 5-7). When the doped regions 140 are doped with an n-type material, this voltage may be positive; when the doped regions 140 are doped with a p-type material, this voltage may be negative. The magnitude of this bias voltage may take any suitable value (e.g., between about 0.25 volts and 2 volts).

In some embodiments, the quantum dot device 100 may include one or more magnet lines 121. For example, a single magnet line 121 is illustrated in FIGS. 1-4, proximate to the trench 103-1. The magnet line 121 may be formed of a conductive material and may be used to conduct current pulses that generate magnetic fields to influence the spin states of one or more of the quantum dots 142 that may form in the quantum well stack 146. In some embodiments, the magnet line 121 may conduct a pulse to reset (or "scramble") nuclear and/or quantum dot spins. In some embodiments, the magnet line 121 may conduct a pulse to initialize an electron in a quantum dot in a particular spin state. In some embodiments, the magnet line 121 may conduct current to provide a continuous, oscillating magnetic field to which the spin of a qubit may couple. The magnet line 121 may provide any suitable combination of these embodiments, or any other appropriate functionality.

In some embodiments, the magnet line 121 may be formed of copper. In some embodiments, the magnet line 121 may be formed of a superconductor, such as aluminum. The magnet line 121 illustrated in FIGS. 1-4 is non-coplanar with the trenches 103, and is also non-coplanar with the gates 106/108. In some embodiments, the magnet line 121 may be spaced apart from the gates 106/108, in the direction of the z-axis of the example coordinate system shown, by a distance 167. The distance 167 may take any suitable value (e.g., based on the desired strength of magnetic field interaction with particular quantum dots 142); in some embodiments, the distance 167 may be between about 25 nanometers and 1 micron (e.g., between about 50 nanometers and 200 nanometers).

In some embodiments, the magnet line 121 may be formed of a magnetic material. For example, a magnetic material (such as cobalt) may be deposited in a trench in the insulating material 130 to provide a permanent magnetic field in the quantum dot device 100.

The magnet line 121 may have any suitable dimensions. For example, the magnet line 121 may have a thickness 169 between about 25 nanometers and 100 nanometers. The magnet line 121 may have a width 171 between about 25 nanometers and 100 nanometers. In some embodiments, the width 171 and thickness 169 of a magnet line 121 may be substantially equal to, respectively, the width and thickness of other conductive lines in the quantum dot device 100 (not shown) used to provide electrical interconnects, as known in the art. The magnet line 121 may have a length 173 that may depend on the number and dimensions of the gates 106/108 that are to form quantum dots 142 with which the magnet line 121 is to interact. The magnet line 121 illustrated in FIGS. 1-4 is substantially linear, but this need not be the case; in general, the magnet lines 121 of the quantum dot devices 100 may take any suitable shape. In other embodiments, micro-magnets may be used instead or in addition to the magnet line 121. Conductive vias 123 may contact the magnet line 121.

The conductive vias 120, 122, 136, and 123 may be electrically isolated from each other by an insulating material 130. The insulating material 130 may be any suitable material, such as an interlayer dielectric (ILD). Examples of the insulating material 130 may include silicon oxide, silicon nitride, aluminum oxide, carbon-doped oxide, and/or silicon oxynitride. As known in the art of IC manufacturing, conductive vias and lines may be formed in an iterative process in which layers of structures are formed on top of each other. In some embodiments, the conductive vias 120/122/136/123 may have a width that is about 20 nanometers or greater at their widest point (e.g., about 30 nanometers), and a pitch of about 80 nanometers or greater (e.g., about 100 nanometers). In some embodiments, conductive lines (not shown) included in the quantum dot device 100 may have a width that is about 100 nanometers or greater, and a pitch of about 100 nanometers or greater. The particular arrangement of conductive vias shown in FIGS. 1-4 is simply illustrative, and any electrical routing arrangement may be implemented.

As discussed above, the structure of the trench 103-1 may be the same as the structure of the trench 103-2; similarly, the construction of gates 106/108 in and around the trench 103-1 may be the same as the construction of gates 106/108 in and around the trench 103-2. The gates 106/108 associated with the trench 103-1 may be mirrored by corresponding gates 106/108 associated with the parallel trench 103-2, and the insulating material 130 may separate the gates 106/108 associated with the different trenches 103-1 and 103-2. In particular, quantum dots 142 formed in the quantum well stack 146 under the trench 103-1 (under the gates 106/108) may have counterpart quantum dots 142 in the quantum well stack 146 under the trench 103-2 (under the corresponding gates 106/108). In some embodiments, the quantum dots 142 under the trench 103-1 may be used as "active" quantum dots in the sense that these quantum dots 142 act as qubits and are controlled (e.g., by voltages applied to the gates 106/108 associated with the trench 103-1) to perform quantum computations. The quantum dots 142 associated with the trench 103-2 may be used as "read" quantum dots in the sense that these quantum dots 142 may sense the quantum state of the quantum dots 142 under the trench 103-1 by detecting the electric field generated by the charge in the quantum dots 142 under the trench 103-1, and may convert the quantum state of the quantum dots 142 under the trench 103-1 into electrical signals that may be detected by the gates 106/108 associated with the trench 103-2. Each quantum dot 142 under the trench 103-1 may be read by its corresponding quantum dot 142 under the trench 103-2. Thus, the quantum dot device 100 enables both quantum computation and the ability to read the results of a quantum computation.

As discussed above, the quantum well stack 146 may include a quantum well layer in which a 2DEG or a 2DHG may form during operation of the quantum dot device 100. The quantum well stack 146 may take any of a number of forms, several of which are illustrated in FIGS. 5-7. The various layers in the quantum well stacks 146 discussed below may be grown on the base 102 (e.g., using epitaxial processes).

Although the singular term "layer" may be used to refer to various components of the quantum well stacks 146 of FIGS. 5-7, any of the layers discussed below may include multiple materials arranged in any suitable manner. In embodiments in which a quantum well stack 146 includes layers other than a quantum well layer 152, layers other than the quantum well layer 152 in a quantum well stack 146 may have higher threshold voltages for conduction than the quantum well layer 152 so that when the quantum well layer 152 is biased at its threshold voltages, the quantum well layer 152 conducts and the other layers of the quantum well stack 146 do not. This may avoid parallel conduction in both the quantum well layer 152 and the other layers, and thus avoid compromising the strong mobility of the quantum well layer 152 with conduction in layers having inferior mobility. In some embodiments, silicon used in a quantum well stack 146 (e.g., in a quantum well layer 152) may be grown from precursors enriched with the 28Si isotope. In some embodiments, germanium used in a quantum well stack 146 (e.g., in a quantum well layer 152) may be grown from precursors enriched with the 70Ge, 72Ge, or 74Ge isotope.

Figure 5:
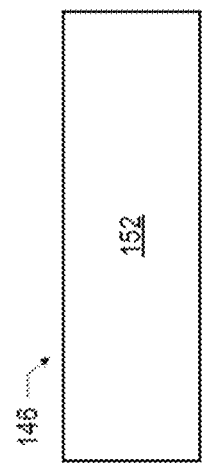
FIGS. 5-7 are cross-sectional views of various examples of quantum well stacks that may be used in a quantum dot device with either trenches or fins, in accordance with various embodiments.

FIG. 5 is a cross-sectional view of a quantum well stack 146 including only a quantum well layer 152. The quantum well layer 152 may be disposed on the base 102, and may be formed of a material such that, during operation of the quantum dot device 100, a 2DEG or a 2DHG may form in the quantum well layer 152 proximate to the upper surface of the quantum well layer 152. The gate dielectric 114 of the gates 106/108 may be disposed on the upper surface of the quantum well layer 152. In some embodiments, the quantum well layer 152 of FIG. 5 may be formed of intrinsic silicon, and the gate dielectric 114 may be formed of silicon oxide; in such an arrangement, during use of the quantum dot device 100, a 2DEG may form in the intrinsic silicon at the interface between the intrinsic silicon and the silicon oxide. Embodiments in which the quantum well layer 152 of FIG. 5 is formed of intrinsic silicon may be particularly advantageous for electron-type quantum dot devices 100. In some embodiments, the quantum well layer 152 of FIG. 5 may be formed of intrinsic germanium, and the gate dielectric 114 may be formed of germanium oxide; in such an arrangement, during use of the quantum dot device 100, a 2DHG may form in the intrinsic germanium at the interface between the intrinsic germanium and the germanium oxide. Such embodiments may be particularly advantageous for hole-type quantum dot devices 100. In some embodiments, the quantum well layer 152 may be strained, while in other embodiments, the quantum well layer 152 may not be strained. The thicknesses (i.e., z-heights) of the layers in the quantum well stack 146 of FIG. 5 may take any suitable values. For example, in some embodiments, the thickness of the quantum well layer 152 (e.g., intrinsic silicon or germanium) may be between about 0.8 microns and 1.2 microns.

Figure 6:
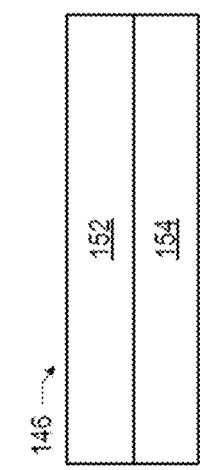

FIG. 6 is a cross-sectional view of a quantum well stack 146 including a quantum well layer 152 and a barrier layer 154. The quantum well stack 146 may be disposed on the base 102 (e.g., as discussed above with reference to FIG. 6) such that the barrier layer 154 is disposed between the quantum well layer 152 and the base 102. The barrier layer 154 may provide a potential barrier between the quantum well layer 152 and the base 102. As discussed above with reference to FIG. 5, the quantum well layer 152 of FIG. 6 may be formed of a material such that, during operation of the quantum dot device 100, a 2DEG or a 2DHG may form in the quantum well layer 152 proximate to the upper surface of the quantum well layer 152. For example, in some embodiments in which the base 102 is formed of silicon, the quantum well layer 152 of FIG. 6 may be formed of silicon, and the barrier layer 154 may be formed of silicon germanium. The germanium content of this silicon germanium may be about 20-80% (e.g., about 30%). In some embodiments in which the quantum well layer 152 is formed of germanium, the barrier layer 154 may be formed of silicon germanium, e.g., with a germanium content of about 20-80% (e.g., about 70%). The thicknesses (i.e., z-heights) of the layers in the quantum well stack 146 of FIG. 6 may take any suitable values. For example, in some embodiments, the thickness of the barrier layer 154 (e.g., silicon germanium) may be between about 0 nanometers and 400 nanometers. In some embodiments, the thickness of the quantum well layer 152 (e.g., silicon or germanium) may be between about 5 nanometers and 30 nanometers.

Figure 7:
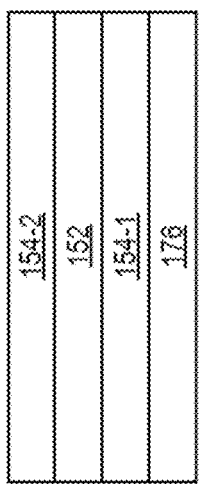

FIG. 7 is a cross-sectional view of a quantum well stack 146 including a quantum well layer 152 and a barrier layer 154-1, as well as a buffer layer 176 and an additional barrier layer 154-2. The quantum well stack 146 may be disposed on the base 102 such that the buffer layer 176 is disposed between the barrier layer 154-1 and the base 102. The buffer layer 176 may be formed of the same material as the barrier layer 154, and may be present to trap defects that form in this material as it is grown on the base 102. In some embodiments, the buffer layer 176 may be grown under different conditions (e.g., deposition temperature or growth rate) from the barrier layer 154-1. In particular, the barrier layer 154-1 may be grown under conditions that achieve fewer defects than the buffer layer 176. In some embodiments in which the buffer layer 176 includes silicon germanium, the silicon germanium of the buffer layer 176 may have a germanium content that varies from the base 102 to the barrier layer 154-1; for example, the silicon germanium of the buffer layer 176 may have a germanium content that varies from zero percent at the silicon base 102 to a nonzero percent (e.g., about 30%) at the barrier layer 154-1. The thicknesses (i.e., z-heights) of the layers in the quantum well stack 146 of FIG. 7 may take any suitable values. For example, in some embodiments, the thickness of the buffer layer 176 (e.g., silicon germanium) may be between about 0.3 microns and 4 microns (e.g., between about 0.3 microns and 2 microns, or about 0.5 microns). In some embodiments, the thickness of the barrier layer 154-1 (e.g., silicon germanium) may be between about 0 nanometers and 400 nanometers. In some embodiments, the thickness of the quantum well layer 152 (e.g., silicon or germanium) may be between about 5 nanometers and 30 nanometers (e.g., about 10 nanometers). The barrier layer 154-2, like the barrier layer 154-1, may provide a potential energy barrier around the quantum well layer 152, and may take the form of any of the embodiments of the barrier layer 154-1. In some embodiments, the thickness of the barrier layer 154-2 (e.g., silicon germanium) may be between about 25 nanometers and 75 nanometers (e.g., about 32 nanometers).

As discussed above with reference to FIG. 6, the quantum well layer 152 of FIG. 7 may be formed of a material such that, during operation of the quantum dot device 100, a 2DEG or a 2DHG may form in the quantum well layer 152 proximate to the upper surface of the quantum well layer 152. For example, in some embodiments in which the base 102 is formed of silicon, the quantum well layer 152 of FIG. 7 may be formed of silicon, and the barrier layer 154-1 and the buffer layer 176 may be formed of silicon germanium. In some such embodiments, the silicon germanium of the buffer layer 176 may have a germanium content that varies from the base 102 to the barrier layer 154-1; for example, the silicon germanium of the buffer layer 176 may have a germanium content that varies from zero percent at the silicon base 102 to a nonzero percent (e.g., about 30%) at the barrier layer 154-1. In other embodiments, the buffer layer 176 may have a germanium content about equal to the germanium content of the barrier layer 154-1 but may be thicker than the barrier layer 154-1 so as to absorb the defects that arise during growth.

In some embodiments, the quantum well layer 152 of FIG. 7 may be formed of germanium, and the buffer layer 176 and the barrier layer 154-1 may be formed of silicon germanium. In some such embodiments, the silicon germanium of the buffer layer 176 may have a germanium content that varies from the base 102 to the barrier layer 154-1; for example, the silicon germanium of the buffer layer 176 may have a germanium content that varies from zero percent at the base 102 to a nonzero percent (e.g., about 70%) at the barrier layer 154-1. The barrier layer 154-1 may in turn have a germanium content equal to the nonzero percent. In other embodiments, the buffer layer 176 may have a germanium content about equal to the germanium content of the barrier layer 154-1 but may be thicker than the barrier layer 154-1 so as to absorb the defects that arise during growth. In some embodiments of the quantum well stack 146 of FIG. 7, the buffer layer 176 and/or the barrier layer 154-2 may be omitted.

Figure 9:
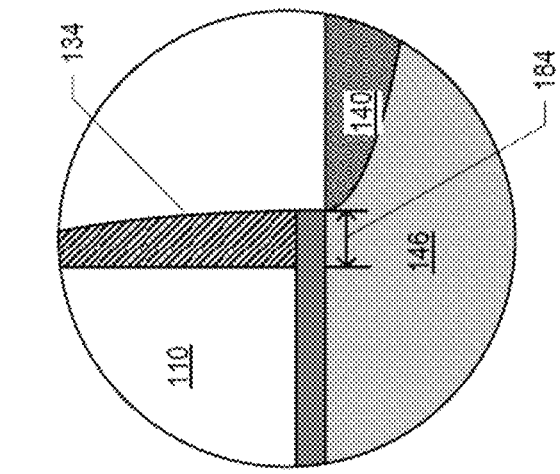
FIGS. 8-9 illustrate detail views of various embodiments of a doped region in a quantum dot device with either trenches or fins, in accordance with various embodiments.
Figure 8:
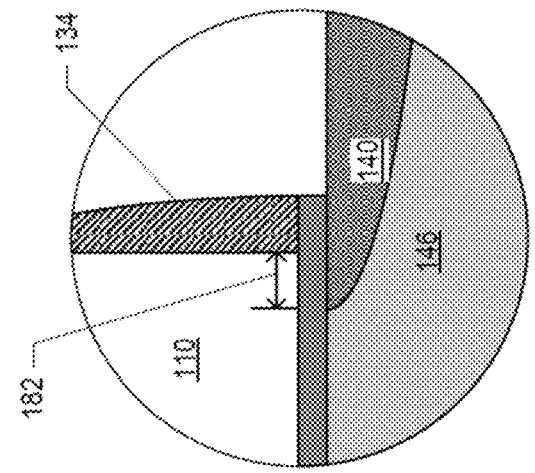

The outer spacers 134 on the outer gates 106, shown, e.g., in FIG. 2, may provide a doping boundary, limiting diffusion of the dopant from the doped regions 140 into the area under the gates 106/108. In some embodiments, the doped regions 140 may extend past the outer spacers 134 and under the outer gates 106. For example, as illustrated in FIG. 8, the doped region 140 may extend past the outer spacers 134 and under the outer gates 106 by a distance 182 between about 0 nanometers and 10 nanometers. In some embodiments, the doped regions 140 may not extend past the outer spacers 134 toward the outer gates 106, but may instead "terminate" under the outer spacers 134. For example, as illustrated in FIG. 9, the doped regions 140 may be spaced away from the interface between the outer spacers 134 and the outer gates 106 by a distance 184 between about 0 nanometers and 10 nanometers. The interface material 141 is omitted from FIGS. 8 and 9 for ease of illustration.

Example Fin-Based Quantum Dot Devices

Another type of quantum dot devices includes devices having a base, a fin extending away from the base, where the fin includes a quantum well layer, and one or more gates disposed on the fin. A quantum dot formed in such a device may be constrained in the x-direction by the one or more gates, in the y-direction by the fin, and in the z-direction by the quantum well layer, as discussed in detail herein. Similar to the quantum dot devices with trenches, described above, and unlike previous approaches to quantum dot formation and manipulation, quantum dot devices with fins provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices. Therefore, this type of a quantum dot device is described as another example quantum dot device in which multiple barrier gates between adjacent plunger gates as described herein may be implemented.

Figure 10:
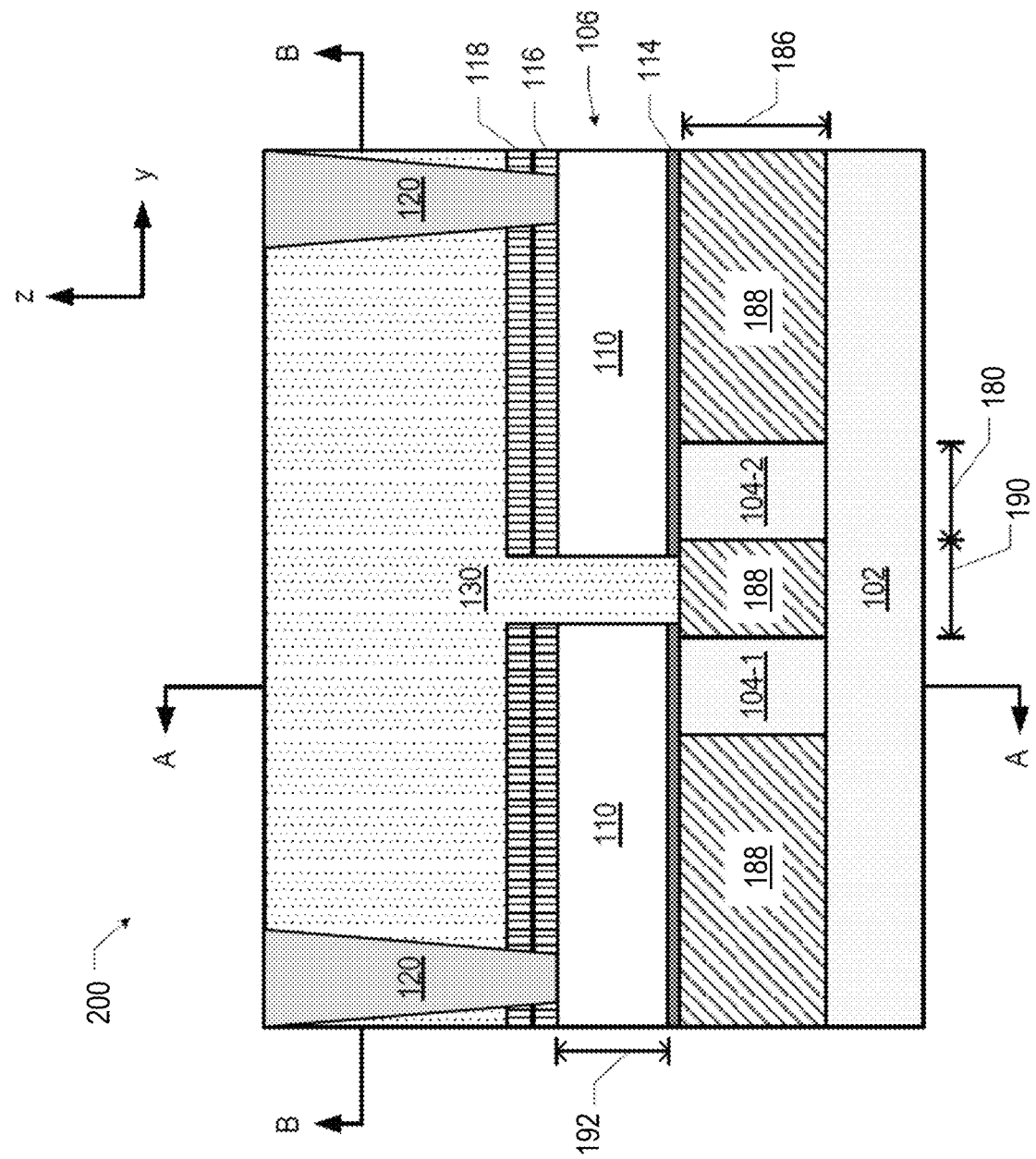
FIGS. 10-12 are cross-sectional and top-down views of an example quantum dot device with fins, according to some embodiments of the present disclosure.
Figure 11:
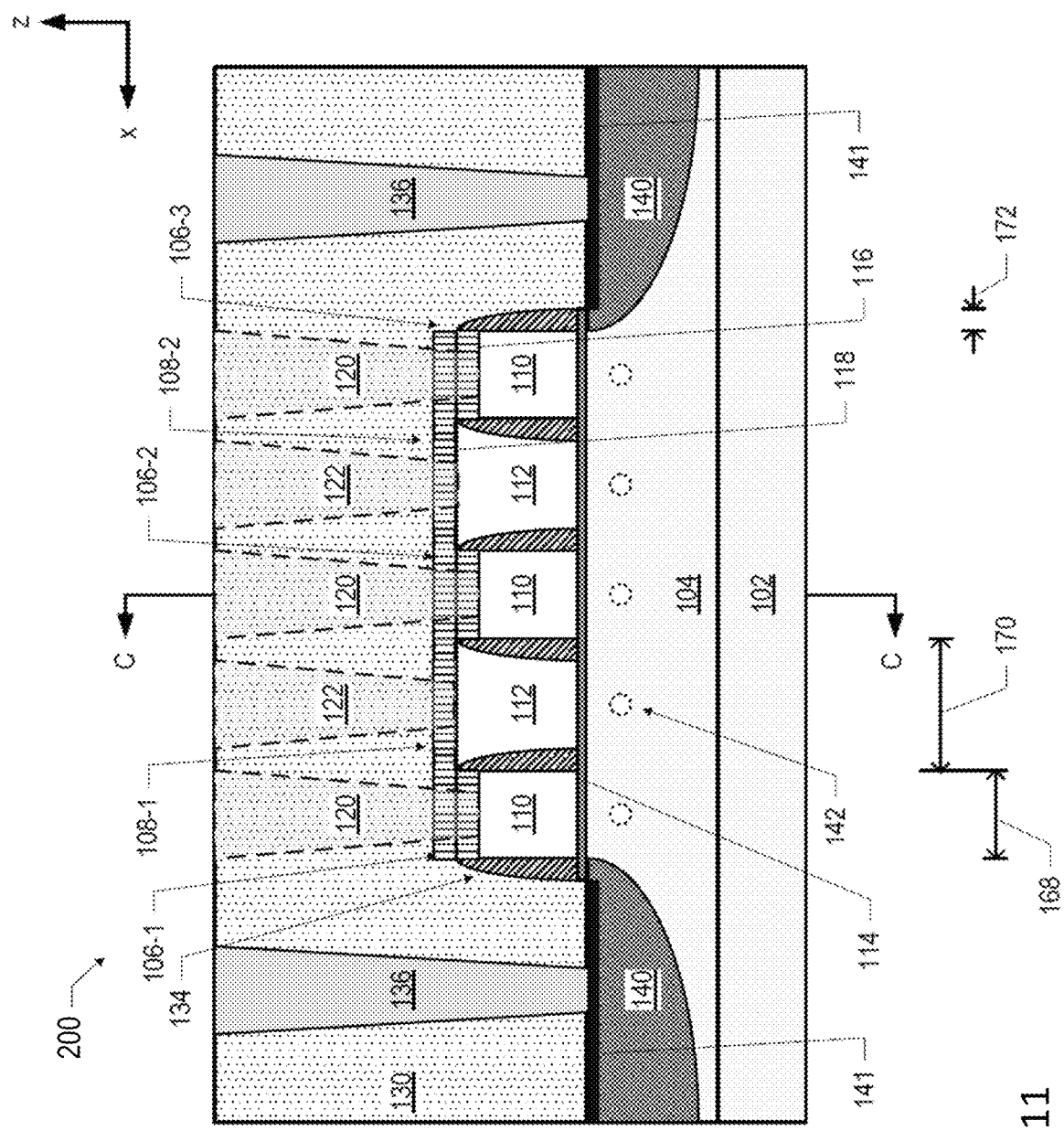
Figure 12:
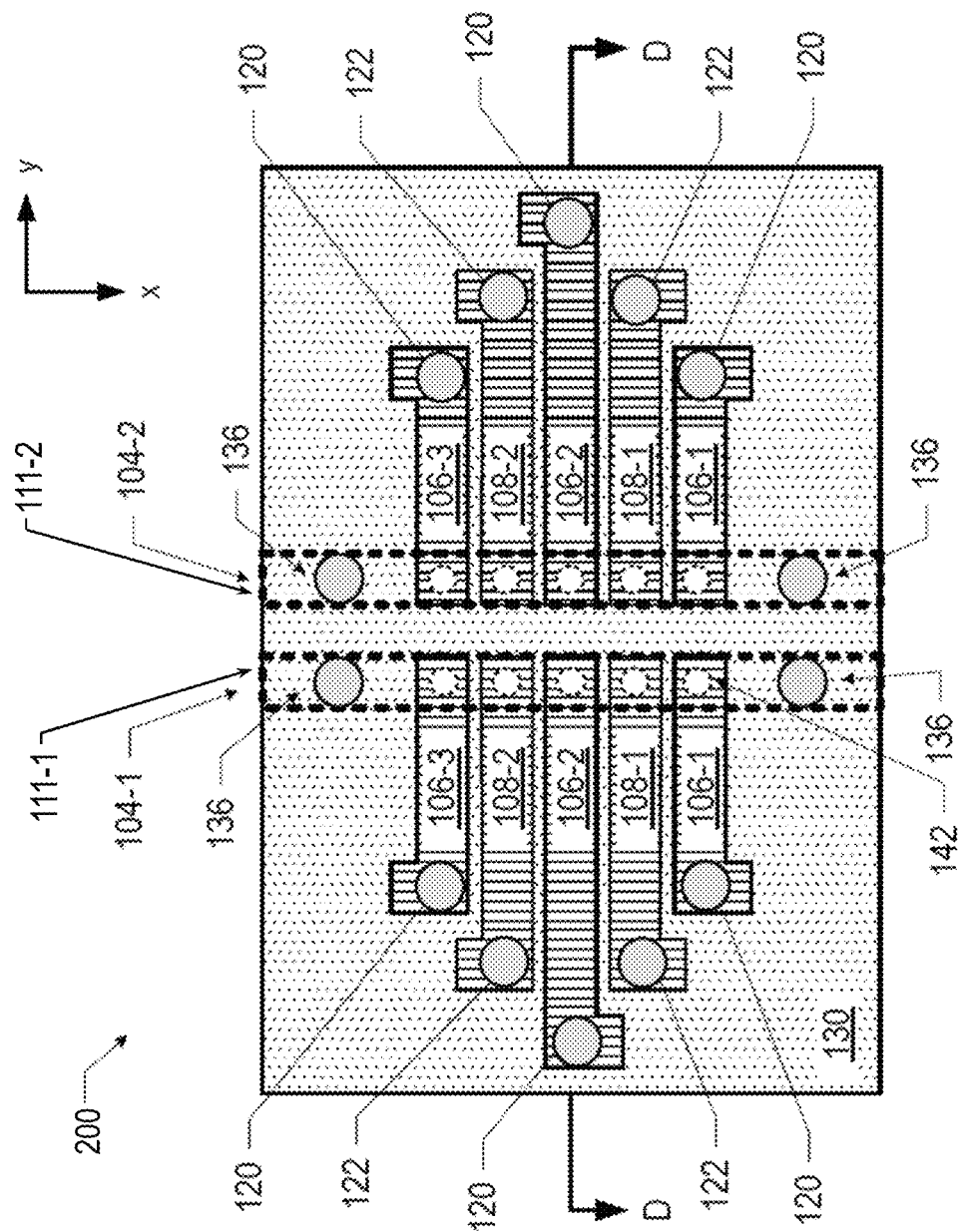

FIGS. 10-12 are cross-sectional views of an example quantum dot device 200 implementing quantum dot qubits, in accordance with various embodiments. In particular, FIG. 11 illustrates the quantum dot device 200 taken along the section A-A of FIG. 10 (while FIG. 10 illustrates the quantum dot device 200 taken along the section C-C of FIG. 11), and FIG. 12 illustrates the quantum dot device 200 taken along the section B-B of FIG. 10 (while FIG. 10 illustrates a quantum dot device 200 taken along the section D-D of FIG. 12). Although FIG. 10 indicates that the cross-section illustrated in FIG. 11 is taken through the fin 104-1, an analogous cross-section taken through the fin 104-2 may be identical, and thus the discussion of FIGS. 10-12 refers generally to the "fin 104."

As shown in FIGS. 10-12, the quantum dot device 200 may include a base 102, similar to the base 102 of the quantum dot device 200 shown in FIGS. 1-4, and multiple fins 104 extending away from the base 102. The base 102 and the fins 104 may include a semiconductor substrate and a quantum well stack (not shown in FIGS. 10-12 but discussed below with reference to the semiconductor substrate 144 and the quantum well stack 146), distributed in any of a number of ways between the base 102 and the fins 104. The base 102 may include at least some of the semiconductor substrate, and the fins 104 may each include a quantum well layer, e.g., a quantum well layer as discussed above with reference to the quantum well layer 152 of FIGS. 5-7. Examples of base/fin arrangements are discussed below with reference to the base fin arrangements 158 of FIGS. 13-19.

Although only two fins, 104-1 and 104-2, are shown in FIGS. 10-12, this is simply for ease of illustration, and more than two fins 104 may be included in the quantum dot device 200. In some embodiments, the total number of fins 104 included in the quantum dot device 200 is an even number, with the fins 104 organized into pairs including one active fin 104 and one read fin 104, as discussed in detail below. When the quantum dot device 200 includes more than two fins 104, the fins 104 may be arranged in pairs in a line (e.g., 2N fins total may be arranged in a 1×2N line, or a 2×N line) or in pairs in a larger array (e.g., 2N fins total may be arranged as a 4×N/2 array, a 6×N/3 array, etc.). As illustrated in FIGS. 10 and 12, in some embodiments, multiple fins 104 may be oriented substantially in parallel. The discussion herein will largely focus on a single pair of fins 104 for ease of illustration, but all the teachings of the present disclosure apply to quantum dot devices 200 with more fins 104.

The quantum dot device 200 of FIGS. 10-12 may include multiple quantum dot formation regions 111 (labeled in FIG. 12), defined by the fins 104. These quantum dot formation regions 111 may be portions of the quantum well stack 146 in which quantum dots 142 may form during operation. The quantum dot formation regions 111 may be arranged as multiple parallel rows defined by the insulating material 188, and the gates 106/108 may each extend over multiple ones of the quantum dot formation regions 111. In the embodiments discussed with reference to FIGS. 10-12, the quantum dot formation regions 111 may be defined by fins 104 separated by portions of insulating material 188; these fins 104 may provide parallel rows of portions of quantum well layers 152 in which quantum dots 142 may form. Thus, the quantum dot formation regions 111 of the quantum dot device 200 of FIGS. 10-12 and of the quantum dot device 100 of FIGS. 1-4 illustrate two different ways of defining the quantum dot formation regions 111.

As noted above, each of the fins 104 may include a quantum well layer (not shown in FIGS. 10-12 but discussed above with reference to the quantum well layer 152). The quantum well layer included in the fins 104 may be arranged normal to the z-direction, and may provide a layer in which a 2DEG or a 2DHG may form to enable the generation of a quantum dot during operation of the quantum dot device 200, as discussed in further detail below. The quantum well layer itself may provide a geometric constraint on the z-location of quantum dots in the fins 104, and the limited extent of the fins 104 (and therefore the quantum well layer) in the y-direction may provide a geometric constraint on the y-location of quantum dots in the fins 104. To control the x-location of quantum dots in the fins 104, voltages may be applied to gates disposed on the fins 104 to adjust the energy profile along the fins 104 in the x-direction and thereby constrain the x-location of quantum dots within quantum wells (discussed in detail below with reference to the gates 106/108). The dimensions of the fins 104 may take any suitable values. For example, in some embodiments, the fins 104 may each have a width 180 between about 5 and 80 nanometers. In some embodiments, the fins 104 may each have a height 186 between about 100 and 400 nanometers (e.g., between about 150 and 350 nanometers, or equal to about 300 nanometers).

The fins 104 may be arranged in parallel, as illustrated in FIGS. 10 and 12, and may be spaced apart by an insulating material 188, which may be disposed on opposite faces of the fins 104. The insulating material 188 of the quantum dot device 200 may be a dielectric material, such as silicon oxide, similar to the insulating material 128 of the quantum dot device 100. For example, in some embodiments, the fins 104 may be spaced apart by a distance 190 between about 100 and 250 microns.

Multiple gates may be disposed on each of the fins 104. In the embodiment illustrated in FIG. 11, three gates 106 and two gates 108 are shown as distributed on the top of the fin 104. Out of the gates 106/108, some gates may be plunger gates and some gates may be barrier gates, where the division between the plunger and the barrier gates among the gates 106/108 may be such as to provide multiple gates between adjacent plunger gates in the quantum dot device 100. The descriptions of multiple gates between adjacent plunger gates provided for the trench-based quantum dot device 100 of FIGS. 1-4 are applicable to the fin-based quantum dot device 200 of FIGS. 10-12 and, therefore, are not repeated. Similar to the gates 106/108 of the trench-based quantum dot device 100, the particular number of gates illustrates for the fin-based quantum dot device 200 is simply illustrative, and any suitable number of gates may be used. Additionally, multiple groups of gates like the gates illustrated in FIG. 11 may be disposed on the fin 104.

Similar to the quantum dot device 100, in the quantum dot device 200, as shown in FIG. 11, the gate 108-1 may be disposed between the gates 106-1 and 106-2, and the gate 108-2 may be disposed between the gates 106-2 and 106-3, and each of the gates 106/108 may include a gate dielectric 114. In the embodiment illustrated in FIG. 11, the gate dielectric 114 for all of the gates 106/108 is provided by a common layer of gate dielectric material. In other embodiments, the gate dielectric 114 for each of the gates 106/108 of the quantum dot device 200 may be provided by separate portions of gate dielectric 114. Descriptions provided with respect to materials of the gate dielectric 114 of the quantum dot device 100 are applicable to the gate dielectric 114 of the quantum dot device 200 and, therefore, are not repeated.

In the quantum dot device 200, each of the gates 106 may include a gate metal 110 and a hardmask 116, similar to those of the quantum dot device 100. The gate metal 110 may be disposed between the hardmask 116 and the gate dielectric 114, and the gate dielectric 114 may be disposed between the gate metal 110 and the fin 104. Only one portion of the hardmask 116 is labeled in FIG. 11 for ease of illustration. In some embodiments, the hardmask 116 may not be present in the quantum dot device 200 (e.g., a hardmask like the hardmask 116 may be removed during processing). In the quantum dot device 200, the sides of the gate metal 110 may be substantially parallel, as shown in FIG. 11, and insulating spacers 134 may be disposed on the sides of the gate metal 110 and the hardmask 116, similar to the insulating spacers 134 of the quantum dot device 100. As illustrated in FIG. 11, the spacers 134 may be thicker closer to the fin 104 and thinner farther away from the fin 104. In some embodiments, the spacers 134 may have a convex shape. Descriptions provided with respect to materials of the gate metal 110, the hardmask 116, and the spacers 134 of the quantum dot device 100 are applicable to those of the quantum dot device 200 and, therefore, are not repeated.

In the quantum dot device 200, each of the gates 108 may include a gate metal 112 and a hardmask 118, similar to those of the quantum dot device 100. The gate metal 112 may be disposed between the hardmask 118 and the gate dielectric 114, and the gate dielectric 114 may be disposed between the gate metal 112 and the fin 104. In the embodiment illustrated in FIG. 11, the hardmask 118 may extend over the hardmask 116 (and over the gate metal 110 of the gates 106), while in other embodiments, the hardmask 118 may not extend over the gate metal 110. In some embodiments, the gate metal 112 may be a different metal from the gate metal 110; in other embodiments, the gate metal 112 and the gate metal 110 may have the same material composition. In some embodiments, the hardmask 118 may not be present in the quantum dot device 200 (e.g., a hardmask like the hardmask 118 may be removed during processing). Descriptions provided with respect to materials of the gate metal 112 and the hardmask 118 of the quantum dot device 100 are applicable to those of the quantum dot device 200 and, therefore, are not repeated.

The gate 108-1 may extend between the proximate spacers 134 on the sides of the gate 106-1 and the gate 106-2 along the longitudinal axis of the fin 104, as shown in FIG. 11. In some embodiments, the gate metal 112 of the gate 108-1 may extend between the spacers 134 on the sides of the gate 106-1 and the gate 106-2 along the longitudinal axis of the fin 104. Thus, the gate metal 112 may have a shape that is substantially complementary to the shape of the spacers 134, as shown in FIG. 11. Similarly, the gate 108-2 may extend between the proximate spacers 134 on the sides of the gate 106-2 and the gate 106-3 along the longitudinal axis of the fin 104. In some embodiments in which the gate dielectric 114 is not a layer shared commonly between the gates 108 and 106, but instead is separately deposited on the fin 104 between the spacers 134, the gate dielectric 114 may extend at least partially up the sides of the spacers 134, and the gate metal 112 may extend between the portions of gate dielectric 114 on the spacers 134. The gate metal 112, like the gate metal 110, may be any suitable metal, such as titanium nitride.

The dimensions of the gates 106/108 in the quantum dot device 200 may take any suitable values. For example, in some embodiments, the z-height 192 of the gate metal 110 may be between about 40 and 75 nanometers (e.g., approximately about 50 nanometers); the z-height of the gate metal 112 may be in the same range. In embodiments like the ones illustrated in FIG. 11, the z-height of the gate metal 112 may be greater than the z-height of the gate metal 110. In some embodiments, the length 168 of the gate metal 110 (i.e., in the x-direction) in the quantum dot device 200 may be substantially the same as in the quantum dot device 100, e.g., between about 20 and 40 nanometers (e.g., about 30 nanometers). In some embodiments, the distance 170 and/or the thickness 172 shown for the quantum dot device 200 of FIG. 11 may be substantially the same as those shown for the quantum dot device 100 of FIG. 2. The length of the gate metal 112 (i.e., in the x-direction) may depend on the dimensions of the gates 106 and the spacers 134, as illustrated in FIG. 11. As indicated in FIG. 10, the gates 106/108 on one fin 104 may extend over the insulating material 188 beyond their respective fins 104 and towards the other fin 104, but may be isolated from their counterpart gates by the intervening insulating material 130.

In the embodiment of the quantum dot device 200 illustrated in FIG. 11, the z-height of the gate metal 112 of the gates 108 may be approximately equal to the sum of the z-height of the gate metal 110 and the z-height of the hardmask 116, as shown. Also, in the embodiment of FIG. 11, the gate metal 112 of the gates 108 may not extend in the x-direction beyond the adjacent spacers 134. In other embodiments, the z-height of the gate metal 112 of the gates 108 may be greater than the sum of the z-height of the gate metal 110 and the z-height of the hardmask 116, and in some such embodiments, the gate metal 112 of the gates may extend beyond the spacers 134 in the x-direction.

As shown in FIG. 11, the gates 106 and 108 may be alternatingly arranged along the fin 104 in the x-direction. During operation of the quantum dot device 200, voltages may be applied to the gates 106/108 to adjust the potential energy in the quantum well layer (not shown) in the fin 104 to create quantum wells of varying depths in which quantum dots 142 may form. Only one quantum dot 142 is labeled with a reference numeral in FIGS. 11 and 12 for ease of illustration, but five are indicated as dotted circles in each fin 104, forming what may be referred to as a "quantum dot array." The location of the quantum dots 142 in FIG. 11 is not intended to indicate a particular geometric positioning of the quantum dots 142. Similar to the quantum dot device 100, in the quantum dot device 200, the spacers 134 may themselves provide "passive" barriers between quantum wells under the gates 106/108 in the quantum well layer, and the voltages applied to different ones of the gates 106/108 may adjust the potential energy under the gates 106/108 in the quantum well layer; decreasing the potential energy may form quantum wells, while increasing the potential energy may form quantum barriers.

The fins 104 may include doped regions 140 that may serve as a reservoir of charge carriers for the quantum dot device 200. Descriptions of the n-type doped region 140, the p-type doped region 140, the interface material 141, how the voltages may be applied to the gates 106/108 to form quantum wells/barriers, how some of the gates 106/108 may be used as plunger gates while other ones of the gates 106/108 may be used as barrier gates, and of conductive vias and lines that may make contact with the gates 106/108 and with the doped regions 140, provided with respect to the quantum dot device 100 are applicable to the quantum dot device 200 and, therefore, are not repeated. As shown in FIGS. 10-12, the gates 106 may extend away from the fins 104, and conductive vias 120 may contact the gates 106 (and are drawn in dashed lines in FIG. 11 to indicate their location behind the plane of the drawing). The gates 108 may similarly extend away from the fins 104, and conductive vias 122 may contact the gates 108 (also drawn in dashed lines in FIG. 11 to indicate their location behind the plane of the drawing). The quantum dot device 200 may include further conductive vias and/or lines (not shown) to make electrical contact to the gates 106/108 and/or the doped regions 140, as desired. Descriptions of the bias voltage that may be applied to the doped regions 140 and of the conductive vias 120, 122, and 136, provided with respect to the quantum dot device 100 are applicable to the quantum dot device 200 and, therefore, are not repeated. Furthermore, although not shown in FIGS. 10-12, in some embodiments, the quantum dot device 200 may include one or more magnet lines such as the magnet line 121 described with reference to the quantum dot device 100.

As discussed above, the structure of the fin 104-1 may be the same as the structure of the fin 104-2; similarly, the construction of gates 106/108 on the fin 104-1 may be the same as the construction of gates 106/108 on the fin 104-2. The gates 106/108 on the fin 104-1 may be mirrored by corresponding gates 106/108 on the parallel fin 104-2, and the insulating material 130 may separate the gates 106/108 on the different fins 104-1 and 104-2. In particular, quantum dots 142 formed in the fin 104-1 (under the gates 106/108) may have counterpart quantum dots 142 in the fin 104-2 (under the corresponding gates 106/108). In some embodiments, the quantum dots 142 in the fin 104-1 may be used as "active" quantum dots in the sense that these quantum dots 142 act as qubits and are controlled (e.g., by voltages applied to the gates 106/108 of the fin 104-1) to perform quantum computations. The quantum dots 142 in the fin 104-2 may be used as "read" quantum dots in the sense that these quantum dots 142 may sense the quantum state of the quantum dots 142 in the fin 104-1 by detecting the electric field generated by the charge in the quantum dots 142 in the fin 104-1, and may convert the quantum state of the quantum dots 142 in the fin 104-1 into electrical signals that may be detected by the gates 106/108 on the fin 104-2. Each quantum dot 142 in the fin 104-1 may be read by its corresponding quantum dot 142 in the fin 104-2. Thus, the quantum dot device 200 enables both quantum computation and the ability to read the results of a quantum computation.

As discussed above, the base 102 and the fin 104 of a quantum dot device 200 may be formed from a semiconductor substrate 144 and a quantum well stack 146 disposed on the semiconductor substrate 144. The quantum well stack 146 may include a quantum well layer in which a 2DEG may form during operation of the quantum dot device 200. The quantum well stack 146 may take any of a number of forms, several of which were illustrated in FIGS. 5-7 and were discussed above, which descriptions are, therefore, not repeated here.

The semiconductor substrate 144 and the quantum well stack 146 may be distributed between the base 102 and the fins 104 of the quantum dot device 200, as discussed above. This distribution may occur in any of a number of ways. For example, FIGS. 13-19 illustrate example base/fin arrangements 158 that may be used in a quantum dot device 200, in accordance with various embodiments.

Figure 13:
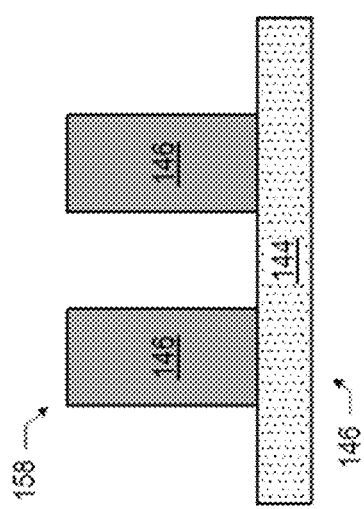

In the base/fin arrangement 158 of FIG. 13, the quantum well stack 146 may be included in the fins 104, but not in the base 102. The semiconductor substrate 144 may be included in the base 102, but not in the fins 104. Manufacturing of the base/fin arrangement 158 of FIG. 13 may include fin etching through the quantum well stack 146, stopping when the semiconductor substrate 144 is reached.

Figure 14:
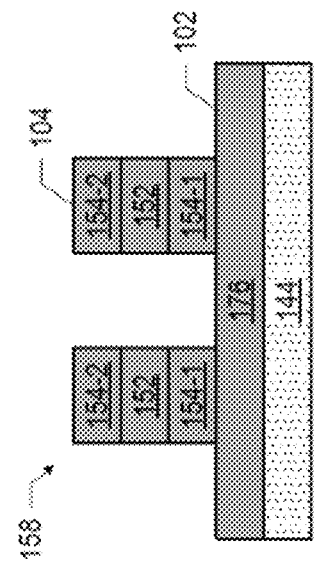
Figure 15:
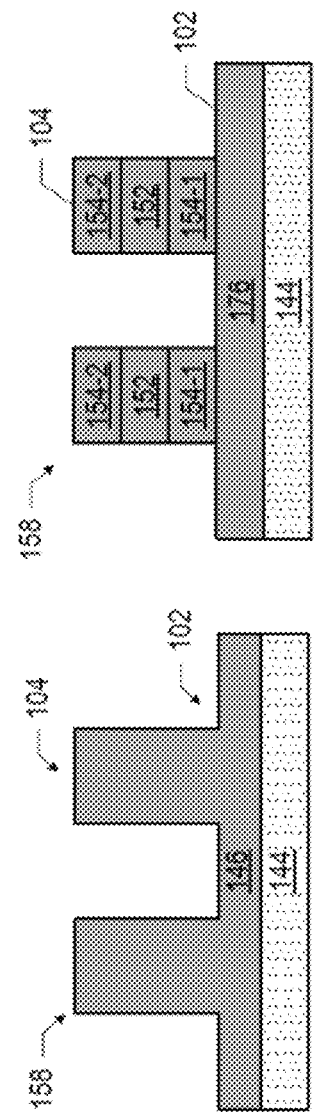

In the base/fin arrangement 158 of FIG. 14, the quantum well stack 146 may be included in the fins 104, as well as in a portion of the base 102. A semiconductor substrate 144 may be included in the base 102 as well, but not in the fins 104. Manufacturing of the base/fin arrangement 158 of FIG. 14 may include fin etching that etches partially through the quantum well stack 146, and stops before the semiconductor substrate 144 is reached. FIG. 15 illustrates a particular embodiment of the base/fin arrangement 158 of FIG. 14. In the embodiment of FIG. 15, the quantum well stack 146 of FIG. 7 is used; the fins 104 include the barrier layer 154-1, the quantum well layer 152, and the barrier layer 154-2, while the base 102 includes the buffer layer 176 and the semiconductor substrate 144.

In the base/fin arrangement 158 of FIG. 16, the quantum well stack 146 may be included in the fins 104, but not the base 102. The semiconductor substrate 144 may be partially included in the fins 104, as well as in the base 102. Manufacturing the base/fin arrangement 158 of FIG. 16 may include fin etching that etches through the quantum well stack 146 and into the semiconductor substrate 144 before stopping. FIG. 17 illustrates a particular embodiment of the base/fin arrangement 158 of FIG. 16. In the embodiment of FIG. 17, the quantum well stack 146 of FIG. 7 is used; the fins 104 include the quantum well stack 146 and a portion of the semiconductor substrate 144, while the base 102 includes the remainder of the semiconductor substrate 144.

Although the fins 104 have been illustrated in many of the preceding figures as substantially rectangular with parallel sidewalls, this is simply for ease of illustration, and the fins 104 may have any suitable shape (e.g., shape appropriate to the manufacturing processes used to form the fins 104). For example, as illustrated in the base/fin arrangement 158 of FIG. 18, in some embodiments, the fins 104 may be tapered. In some embodiments, the fins 104 may taper by 3-10 nanometers in x-width for every 100 nanometers in z-height (e.g., 5 nanometers in x-width for every 100 nanometers in z-height). When the fins 104 are tapered, the wider end of the fins 104 may be the end closest to the base 102, as illustrated in FIG. 18. FIG. 19 illustrates a particular embodiment of the base/fin arrangement 158 of FIG. 18. In FIG. 19, the quantum well stack 146 is included in the tapered fins 104 while a portion of the semiconductor substrate 144 is included in the tapered fins and a portion of the semiconductor substrate 144 provides the base 102.

Example Gate Arrangements with Multiple Barrier Gates Between Adjacent Plunger Gates FIGS. 20A-20D illustrate effects of applying voltages to different gates of a gate arrangement with multiple barrier gates between adjacent plunger gates, in accordance with some embodiments. In particular, each of FIGS. 20A-20D has a top illustration showing a gate arrangement 300, and a bottom illustration showing electrochemical potential as a function of distance for some example voltages applied to various gates of the gate arrangement 300.

The gate arrangement 300 is the same in different ones of FIGS. 20A-20D and includes a first plunger gate (labeled as a gate $P_1$), a second plunger gate (labeled as a gate $P_2$), a first barrier gate (labeled as a gate $B_1$), and a second barrier gate (labeled as a gate $B_2$), where the first barrier gate $B_1$ is between the first plunger gate $P_1$ and the second barrier gate $B_2$, and the second barrier gate $B_2$ is between the first barrier gate $B_1$ and the second plunger gate $P_2$. The gates $P_1$, $B_1$, $B_2$, and $P_2$ of the gate arrangement 300 may be examples of the consecutive gates of the gates 106/108 within a trench 103 (either an active trench or a read trench) of the quantum dot device 100, described above, or over a fin 104 (either an active fin or a read fin) of the quantum dot device 200, described above. In either case, the gate arrangement 300 may be provided over a quantum well stack, e.g., a quantum well stack 146, described above, and each of the gates $P_1$, $B_1$, $B_2$, and $P_2$ may include a gate metal (e.g., the gate metal 110/112) and a gate dielectric (e.g., the gate dielectric 114) between the quantum well stack 146 and the gate metal 110/112. In some embodiments, each of the gates $P_1$, $B_1$, $B_2$, and $P_2$ may be provided as a respective via extending through an insulating material (e.g., the insulating material 128 and, optionally, also the insulating material 130, described above) to the quantum well stack 146, so that the gate metal (e.g., the gate metal 110/112) at least partially fills the via and the gate dielectric (e.g., the gate dielectric 114) is at a bottom of the via, between the quantum well stack 146 below the via and the gate metal in the via.

As shown in the top illustration of FIGS. 20A-20D, the gates $P_1$, $B_1$, $B_2$, and $P_2$ may be provided over a quantum dot formation region 111, as described above. In the embodiments where the quantum dot formation region 111 is a row, the gates $P_1$, $B_1$, $B_2$, and $P_2$ may be arranged along a substantially straight line. The gates $P_1$ and $P_2$ are adjacent plunger gates in that there are no other plunger gates arranged over the quantum dot formation region 111 between the gates $P_1$ and $P_2$. The gates $B_1$ and $B_2$ are multiple barrier gates between the adjacent plunger gates $P_1$ and $P_2$ in that, for the first barrier gate $B_1$, nearest two gates are the first plunger gate $P_1$ and the second barrier gate $B_2$, and, for the second barrier gate $B_2$, nearest two gates are the first barrier gate $B_1$ and the second plunger gate $P_2$. In some embodiments, the first plunger gate $P_1$ and the second barrier gate $B_2$ may be substantially equidistant to the first barrier gate $B_1$. In some embodiments, the first barrier gate $B_1$ and the second plunger gate $P_2$ may be substantially equidistant to the second barrier gate $B_2$; although in other embodiments distances between any pair of closest ones of the gates $P_1$, $B_1$, $B_2$, and $P_2$ may be different. In further embodiments, additional barrier gates besides the barrier gates $B_1$ and $B_2$ may be present between the adjacent plunger gates $P_1$ and $P_2$, e.g., as explained above with reference to the gates 106-1 and 106-3 being adjacent plunger gates (i.e., the gates 106-1 and 106-3 corresponding to the plunger gates $P_1$ and $P_2$ of the gate arrangement 300) and the gates 108-1, 106-2, and 108-2 being multiple barrier gates (i.e., two of the gates 108-1, 106-2, and 108-2 corresponding to the barrier gates $B_1$ and $B_2$ of the gate arrangement 300 and the third one of the gates 108-1, 106-2, and 108-2 being the third barrier gate for the gate arrangement 300).

The multiple gates between adjacent plunger gates of the quantum dot devices proposed herein may be individually addressable. For example, a first interconnect may be coupled to the first barrier gate $B_1$ and a second interconnect may be coupled to the second barrier gate $B_2$, so that the first barrier gate $B_1$ and the second barrier gate $B_2$ (and their corresponding interconnects) are electrically isolated from one another. Furthermore, the multiple gates between adjacent plunger gates of the quantum dot devices proposed herein may be configured so that only when suitable voltages are applied to at least two of the multiple gates between adjacent plunger gates may the coupling of the quantum dots formed under the adjacent plunger gates take place. Thus, for the gate arrangement 300, when voltages are applied to the plunger gates $P_1$ and $P_2$ so that respective quantum dots are formed under these gates, the quantum dots are only allowed to interact when suitable voltages are applied to both the barrier gate $B_1$ and the barrier gate $B_2$. Which voltage is "suitable" to enable coupling of the quantum dots between the adjacent plunger gates $P_1$ and $P_2$ of the gate arrangement 300 depends on the type of the quantum dots 142 and on the nature of the interaction between the quantum dots that is desired. For example, the polarity of the voltages applied to the gates of the gate arrangement 300 to form quantum wells/barriers depends on the charge carriers used in the quantum dot device in which the gate arrangement 300 is included. In embodiments in which the charge carriers are electrons (and thus the quantum dots formed under the adjacent plunger gates $P_1$ and $P_2$ of the gate arrangement 300 are electron-type quantum dots), amply negative voltages applied to the barrier gates $B_1$ and/or $B_2$ may increase the potential barrier under these barrier gates, and amply positive voltages applied to the barrier gates $B_1$ and/or $B_2$ may decrease the potential barrier under these gates (thereby widening potential well in which the electron-type quantum dots 142 under the plunger gates $P_1$ and $P_2$ are formed). In embodiments in which the charge carriers are holes (and thus the quantum dots formed under the adjacent plunger gates $P_1$ and $P_2$ of the gate arrangement 300 are hole-type quantum dots), amply positive voltages applied to the barrier gates $B_1$ and/or $B_2$ may increase the potential barrier under these gates, and amply negative voltages applied to the barrier gates $B_1$ and/or $B_2$ may decrease the potential barrier under these gates (thereby widening potential well in which the hole-type quantum dots 142 under the plunger gates $P_1$ and $P_2$ are formed).

Application of different voltages to the gates of the gate arrangement 300 to adjust the potential energy in the quantum well stack 146 to create quantum wells of varying depths in which quantum dots 142 may form and interact will now be described with reference to the bottom illustrations of FIGS. 20A-20D. Each of the bottom illustrations of FIGS. 20A-20D shows an electrochemical potential (measured along the vertical axis), indicative of a depth of a quantum well, as a function of distance (measured along the horizontal axis) from a given gate. The bottom illustrations of FIGS. 20A-20D differ in the voltages applied to various gates of the gate arrangement 300. For each of the bottom illustrations of FIGS. 20A-20D, voltages are applied, simultaneously, to the plunger gates $P_1$ and $P_2$, to enable formation of a quantum dot 142-1 under the plunger gate $P_1$ and formation of a quantum dot 142-2 under the plunger gate $P_2$. Electron wavefunctions of the quantum dots 142-1 and 142-2 are represented in the bottom illustrations of FIGS. 20A-20D as wavefunctions 302-1 and 302-2, respectively, and a line 304 shown in the bottom illustrations of FIGS. 20A-20D represents a function of the electrochemical potential (measured along the vertical axis of the bottom illustrations of FIGS. 20A-20D) versus distance (measured along the horizontal axis of the bottom illustrations of FIGS. 20A-20D) between the gates of the gate arrangements 300.

The bottom illustration of FIG. 20A shows a scenario where either no voltages are applied to the barrier gates $B_1$ and $B_2$, or such voltages are applied to the barrier gates $B_1$ and $B_2$ as to create a significant tunnel barrier between the quantum dots 142-1 and 142-2. The tunnel barrier is represented in FIG. 20A with a peak 306 in the line 304 representing electrochemical potential between the electron wavefunctions 302-1 and 302-2 of the quantum dots 142-1 and 142-2. The electron wavefunctions 302-1 and 302-2 may be substantially centered along the valleys 308-1 and 308-2, respectively, in the line 304, the valleys 308 representing the quantum wells in which the quantum dots 142 form. Because the electron wavefunctions 302-1 and 302-2 do not overlap in the bottom illustration of FIG. 20A, the quantum dots 142-1 and 142-2 are not coupled.

Figure 20C:
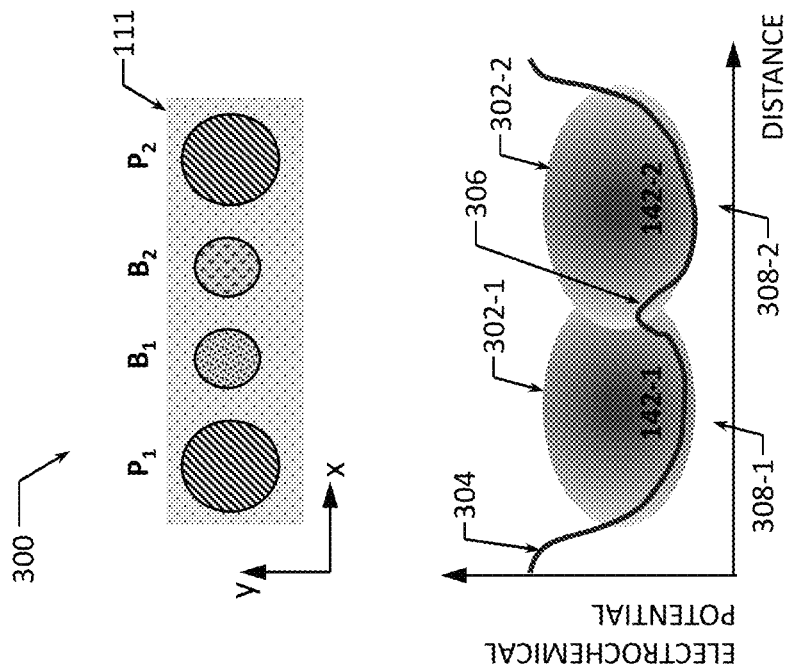
Figure 20D:
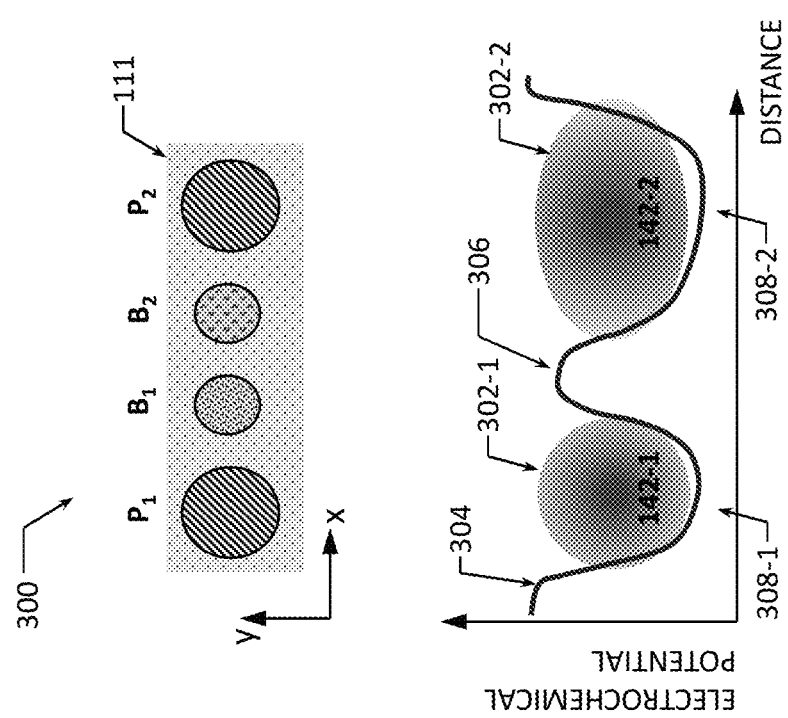

As described above, voltages may be applied to each of the gates 106 and 108 (and, therefore, to the gates of the gate arrangement 300) separately to adjust the potential energy in the quantum well stack 146 under the gates 106 and 108 and to tune the relative potential energy profiles under different ones of the gates 106 and 108 to modify the potential interaction between quantum dots 142 under adjacent gates. The bottom illustration of FIG. 20B shows a scenario where such a voltage is applied to the barrier gate $B_1$ as to decrease the width and/or the height of the potential barrier between the electron wavefunctions 302-1 and 302-2 (i.e., voltages are still applied to the plunger gates $P_1$ and $P_2$ so the quantum dots 142 are present under these gates, but no suitable voltage is applied to the barrier gate $B_2$). However, even though the electron wavefunction 302-1 now extends closer to the electron wavefunction 302-2, it is still not enough to enable coupling between the quantum dots 142-1 and 142-2. Thus, only applying a suitable voltage to the barrier gate $B_1$ but not to the barrier gate $B_2$ is not enough to allow coupling of the quantum dots 142 formed under the plunger gates $P_1$ and $P_2$. Similarly, only applying a suitable voltage to the barrier gate $B_2$ but not to the barrier gate $B_1$ is not enough to allow coupling of the quantum dots formed under the plunger gates $P_1$ and $P_2$, as is shown in the bottom illustration of FIG. 20C, depicting a scenario where such a voltage is applied to the barrier gate $B_2$ as to decrease the width and/or the height of the potential barrier between the electron wavefunctions 302-1 and 302-2 but no suitable voltage is applied to the barrier gate $B_2$. Only when suitable voltages are applied to both, the barrier gate $B_1$ and the barrier gate $B_2$, may coupling of the quantum dots 142 formed under the plunger gates $P_1$ and $P_2$ take place, as is shown in the bottom illustration of FIG. 20D, depicting a scenario where such voltages are applied to the barrier gates $B_1$ and $B_2$ as to decrease the width and/or the height of the potential barrier between the electron wavefunctions 302-1 and 302-2 enough to allow for the electron wavefunctions 302-1 and 302-2 to overlap. When the electron wavefunctions 302-1 and 302-2 sufficiently overlap, the quantum dots 142-1 and 142-2 are coupled to one another.

While illustrations of FIGS. 20A-20D illustrate gate arrangements with only two barrier gates between adjacent plunger gates, in further embodiments, more than two barrier gates may be included, which may allow greater tunability of which quantum dots are allowed to interact, especially for two-dimensional and three-dimensional arrays of quantum dots. Providing individually controllable multiple barrier gates between two adjacent plunger gates may allow realizing scalable crossbar schemes of interconnects to apply control signals to individual gates for many types of arrays (i.e., for many 2D qubit layouts). Some examples of such interconnect arrangements are shown in FIGS. 21A-21D, providing top-down views of example quantum dot devices 400 with multiple barrier gates between adjacent plunger gates, in accordance with various embodiments. The views of FIGS. 21A-21D are similar to the top-down views of FIGS. 4 and 12, except that 1) FIGS. 21A-21D show examples of quantum dot devices with more gates than just the five gates for each of the two quantum dot formation regions 111 shown in the examples of FIGS. 4 and 12, 2) FIGS. 21A-21D show examples of quantum dot devices with plunger gates arranged in rows 402 and columns 404, and 3) FIGS. 21A-21D do not show other elements of the quantum dot devices, such as insulating materials, hardmasks, gate dielectrics, etc., in order to not clutter the drawings.

Figure 21A:
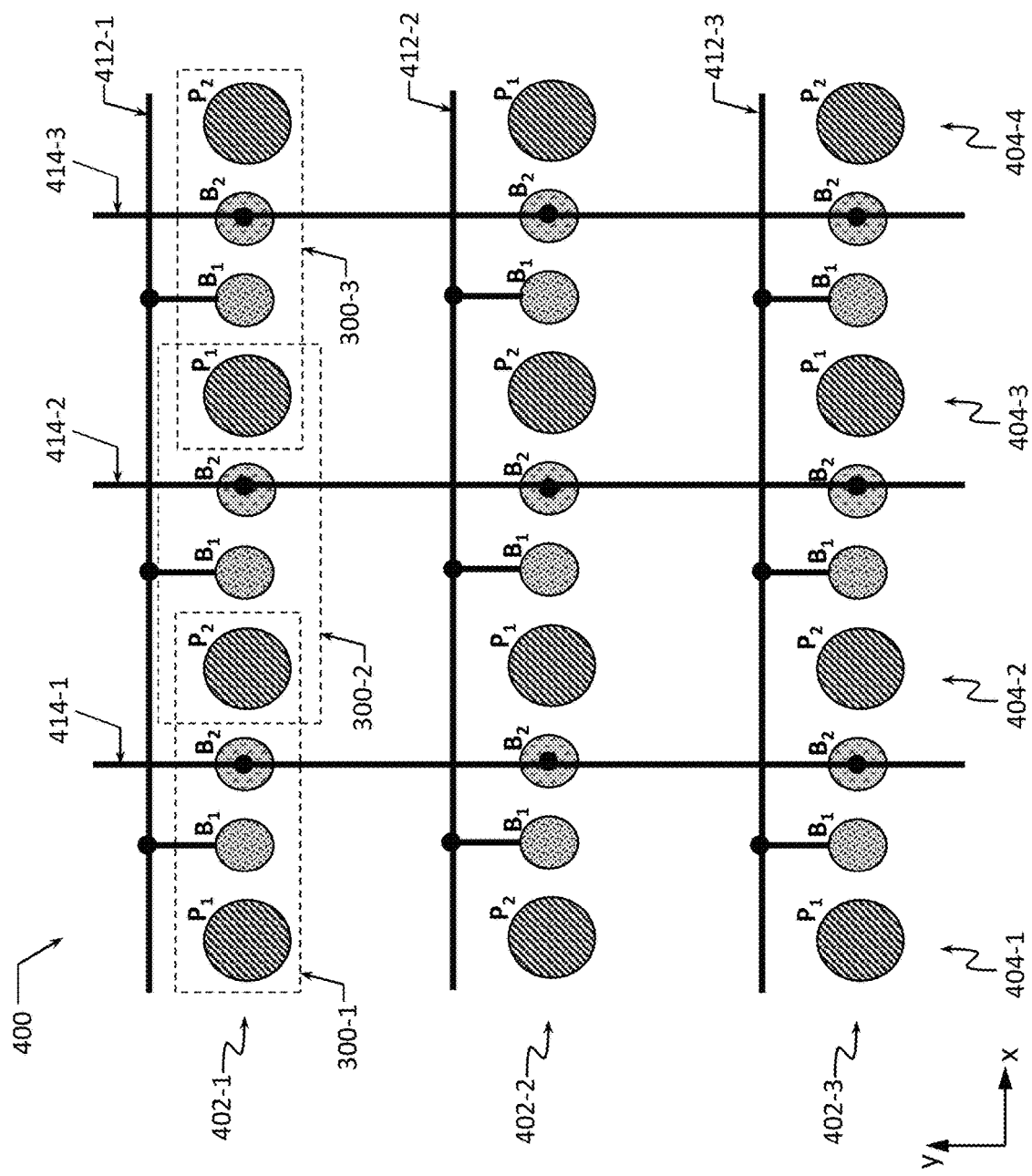
FIGS. 21A-21D are top-down views of example quantum dot devices with multiple barrier gates between adjacent plunger gates, in accordance with various embodiments.
Figure 21B:
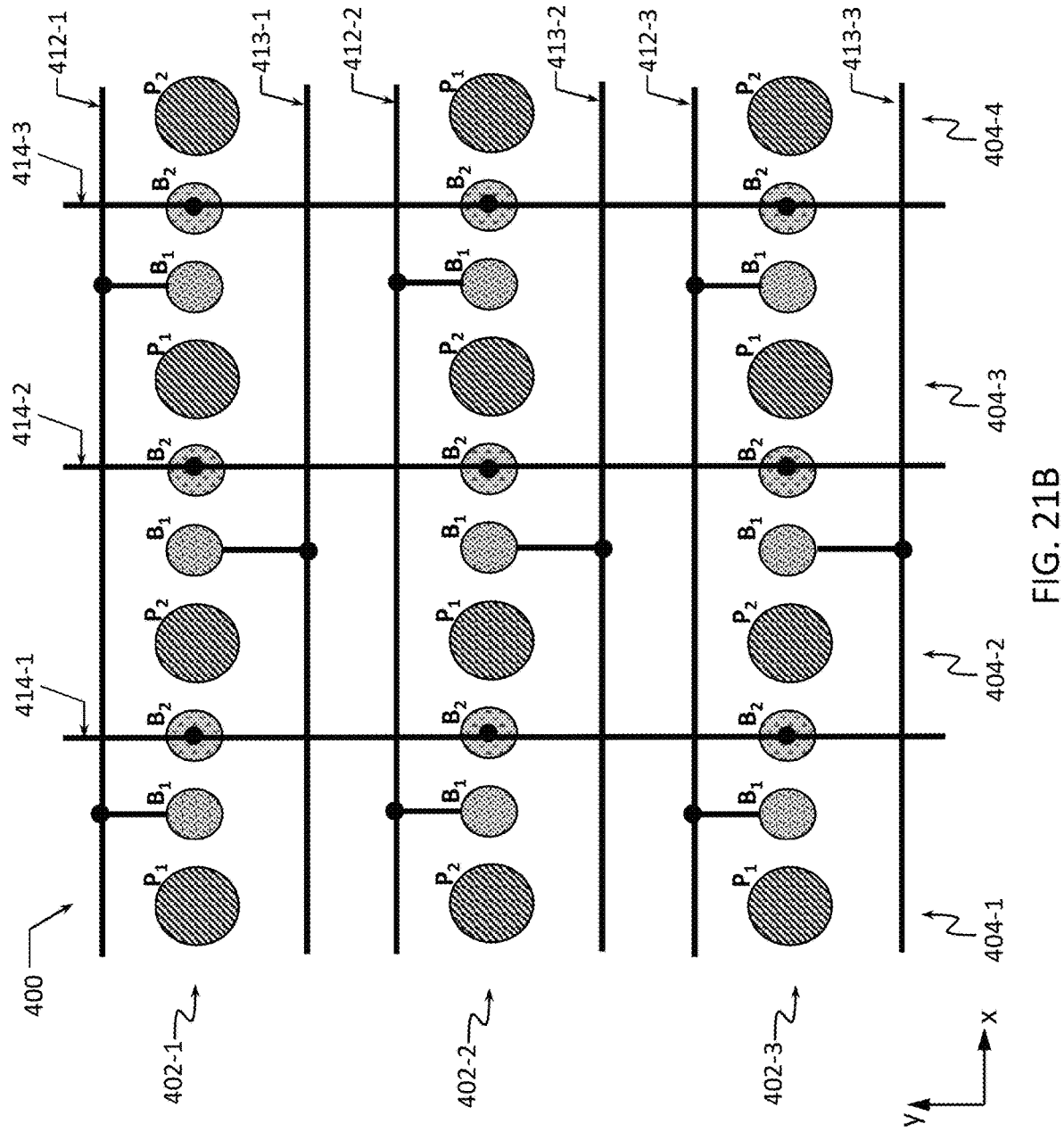
Figure 21C:
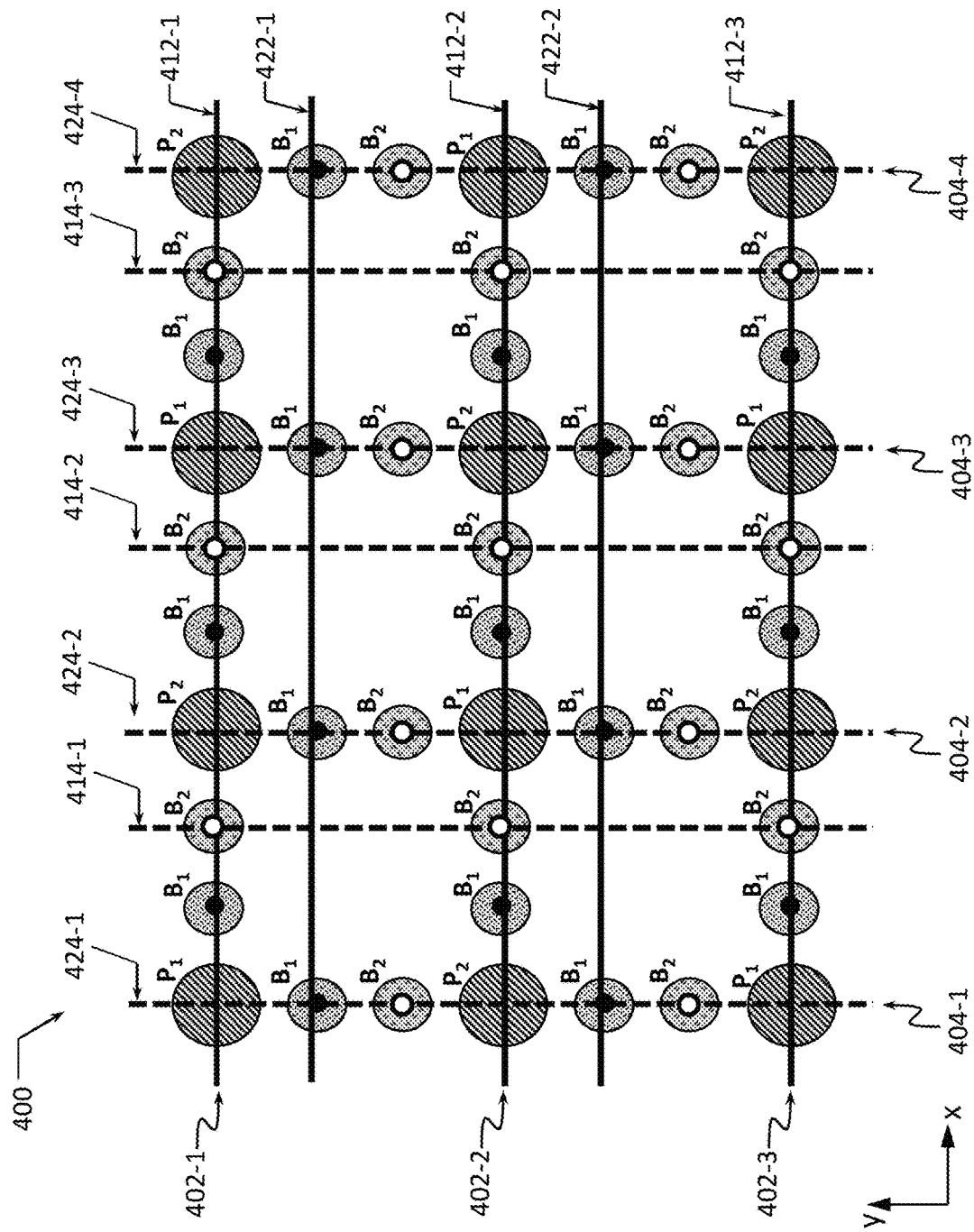
Figure 21D:
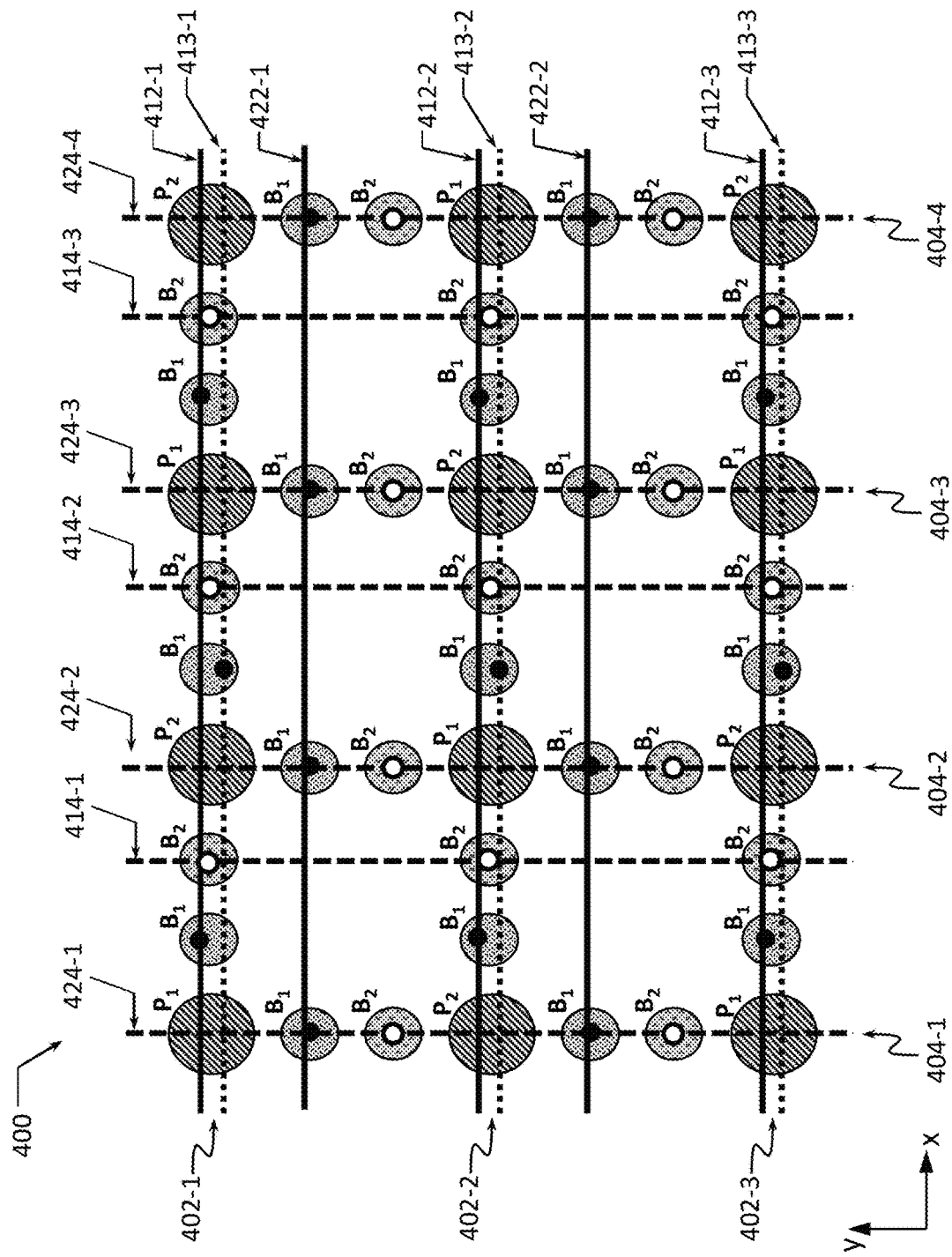

FIGS. 21A-21D illustrate 2D arrays of plunger and barrier gates, showing three rows 402 (labeled as rows 402-1, 402-2, and 402-3) and four columns 404 (labeled as columns 404-1, 404-2, 404-3, and 404-4) of the plunger gates. This particular number of rows 402 and columns 404 is simply illustrative, and any suitable number of plunger gates may be used in other embodiments. The quantum dot devices 400 shown in FIGS. 21A-21D may be implemented according to any embodiments of the quantum dot devices 100 or the quantum dot devices 200, described herein, with gate arrangements where multiple barrier gates are provided between at least some of the adjacent plunger gates, e.g., the gate arrangements 300. How the gate arrangements 300 may be included in a 2D array of gates is shown in FIG. 21A by providing labels for the gate arrangements 300-1, 300-2, and 300-3 for the row 402-1, which gate arrangements are shown within respective dashed contours. These labels are not provided for other rows 402 shown in FIG. 21A, nor are they shown for any of the rows 402 or the columns 404 shown in FIGS. 21B-21D in order to not clutter those drawings. FIGS. 21A-21D illustrate examples where two barrier gates, $B_1$ and $B_2$, are included between some pairs of adjacent plunger gates, $P_1$ and $P_2$, with the labels for the individual gates provided at the top right corner of the gates. FIGS. 21-21D illustrate gate lines electrically coupled to various barrier gates, where the gate lines are shown as thick black lines (e.g., gate lines 412 and 414), and where electrical coupling is illustrated with dots. For example, in FIGS. 21A-21B, gate lines crossing one another without a dot are not electrically coupled (i.e., are electrically isolated from one another), or, in another example, in FIGS. 21C-21D, gate lines crossing barrier or plunger gates without a dot are not coupled to those gates. Furthermore, FIGS. 21C-21D illustrate dots coupled to some gate lines but not others differently (e.g., black and white dots), as described in greater detail below. FIGS. 21A-21D do not show gate lines for providing control signals to the plunger gates in order to not clutter the drawings. Such gate lines may be routed in any manner that is suitable for a particular design.

Turning to the details of FIGS. 21A-21D, the quantum dot device 400 shown in FIG. 21A includes, for each of the rows 402, a respective gate line 412 electrically coupled to all first barrier gates $B_1$ of a given row 402. For example, a gate line 412-1 is coupled to (e.g., is electrically continuous among, or shared among) all of the barrier gates $B_1$ that are between adjacent plunger gates arranged along the row 402-1, a gate line 412-2 is coupled to (e.g., is electrically continuous among, or shared among) all of the barrier gates $B_1$ that are between adjacent plunger gates arranged along the row 402-2, a gate line 412-3 is coupled to (e.g., is electrically continuous among, or shared among) all of the barrier gates $B_1$ that are between adjacent plunger gates arranged along the row 402-3, and so on. The rows 402 may be rows of quantum dot formation regions 111, as described above. The quantum dot device 400 shown in FIG. 21A further includes, for each of the columns 404, a respective gate line 414 electrically coupled to (e.g., is electrically continuous among, or shared among) all second barrier gates $B_2$ arranged between a given pair of adjacent columns 404 in different rows 402. For example, a gate line 414-1 is coupled to the barrier gate $B_2$ that is arranged along the row 402-1 between adjacent plunger gates in columns 404-1 and 404-2, the barrier gate $B_2$ that is arranged along the row 402-2 between adjacent plunger gates in columns 404-1 and 404-2, the barrier gate $B_2$ that is arranged along the row 402-3 between adjacent plunger gates in columns 404-1 and 404-2, and so on; a gate line 414-2 is coupled to the barrier gate $B_2$ that is arranged along the row 402-1 between adjacent plunger gates in columns 404-2 and 404-3, the barrier gate $B_2$ that is arranged along the row 402-2 between adjacent plunger gates in columns 404-2 and 404-3, the barrier gate $B_2$ that is arranged along the row 402-3 between adjacent plunger gates in columns 404-2 and 404-3, and so on; a gate line 414-3 is coupled to the barrier gate $B_2$ that is arranged along the row 402-1 between adjacent plunger gates in columns 404-3 and 404-4, the barrier gate $B_2$ that is arranged along the row 402-2 between adjacent plunger gates in columns 404-3 and 404-4, the barrier gate $B_2$ that is arranged along the row 402-3 between adjacent plunger gates in columns 404-3 and 404-4, and so on. Thus, for the quantum dot device 400 shown in FIG. 21A, if the number of rows 402 is N and the number of columns 404 is M (where each of N and M is an integer greater than one), then N gate lines 412 and M−1 gate lines 414 may be implemented to provide coupling between all pairs of adjacent plunger gates in each of the rows 402.

As described above, in order to couple quantum dots formed under two adjacent plunger gates, suitable voltages are to be applied to both of the barrier gates $B_1$ and $B_2$ between these plunger gates. For the quantum dot device 400 shown in FIG. 21A this means that, for example, in order to couple quantum dots formed under a plunger gate $P_1$ of the row 402-1, column 404-1 and a plunger gate $P_2$ of the row 402-1, column 404-2, suitable voltages are to be applied to the gate lines 412-1 and 414-1. In another example, in order to couple quantum dots formed under a plunger gate $P_2$ of the row 402-2, column 404-3 and a plunger gate $P_1$ of the row 402-2, column 404-4, suitable voltages are to be applied to the gate lines 412-2 and 414-3. In yet another example, in order to couple quantum dots formed under a plunger gate $P_1$ of the row 402-3, column 404-1 and a plunger gate $P_2$ of the row 402-3, column 404-2, suitable voltages are to be applied to the gate lines 412-3 and 414-1.

The quantum dot device 400 shown in FIG. 21B is similar to that shown in FIG. 21A except that not all of the barrier gates $B_1$ of a given row 402 are coupled to a single shared gate line 412 for that row. Instead, some of the barrier gates $B_1$ of a given row 402 are coupled to a shared gate line 412 for that row, while other ones of the barrier gates $B_1$ of that row 402 are coupled to a shared gate line 413 for that row (i.e., there are two shared gate lines 412, 413, for each row 402). For example, for a given row 402, coupling of different first barrier gates $B_1$ to the gate lines 412 and 413 may be in an alternating manner. For example, as shown in FIG. 21B, a gate line 412-1 may be coupled to all odd barrier gates $B_1$ that are between adjacent plunger gates arranged along the row 402-1, and a gate line 413-1 may be coupled to all even barrier gates $B_1$ that are between adjacent plunger gates arranged along the row 402-1; a gate line 412-2 may be coupled to all odd barrier gates $B_1$ that are between adjacent plunger gates arranged along the row 402-2, and a gate line 413-2 may be coupled to all even barrier gates $B_1$ that are between adjacent plunger gates arranged along the row 402-2; a gate line 412-3 may be coupled to all odd barrier gates $B_1$ that are between adjacent plunger gates arranged along the row 402-3, and a gate line 413-3 may be coupled to all even barrier gates $B_1$ that are between adjacent plunger gates arranged along the row 402-3, and so on. Thus, for the quantum dot device 400 shown in FIG. 21B, if the number of rows 402 is N and the number of columns 404 is M (where each of N and M is an integer greater than one), then N gate lines 412, N gate lines 413, and M−1 gate lines 414 may be implemented to provide coupling between all pairs of adjacent plunger gates in each of the rows 402.

Again, in order to couple quantum dots formed under two adjacent plunger gates, suitable voltages are to be applied to both of the barrier gates $B_1$ and $B_2$ between these plunger gates. For the quantum dot device 400 shown in FIG. 21B this means that, for example, in order to couple quantum dots formed under a plunger gate $P_1$ of the row 402-1, column 404-1 and a plunger gate $P_2$ of the row 402-1, column 404-2, suitable voltages are to be applied to the gate lines 412-1 and 414-1 of the quantum dot device 400 of FIG. 21B, while, in order to couple quantum dots formed under a plunger gate $P_2$ of the row 402-1, column 404-2 and a plunger gate $P_1$ of the row 402-1, column 404-3, suitable voltages are to be applied to the gate lines 413-1 and 414-1.

The quantum dot device 400 shown in FIG. 21C is similar to that shown in FIG. 21A except that it further includes first and second barrier gates $B_1$, $B_2$ between adjacent pairs of plunger gates in a given column 404. Thus, as shown in FIG. 21C, there are two barrier gates $B_1$, $B_2$ between a plunger gate in the row 402-1 and a plunger gate in the row 402-2, and two barrier gates $B_1$, $B_2$ between a plunger gate in the row 402-2 and a plunger gate in the row 402-3 for each of the columns 404-1, 404-2, 404-3, and 404-4. With more barrier gates, illustrating gate lines coupled to individual barrier gates becomes more complicated, so the following notation is used in FIG. 21C as well as FIG. 21D: solid lines 412 and 422 are gate lines coupled to the barrier gates $B_1$, as shown with black dots overlapping these lines and the respective barrier gates $B_1$, while dashed lines 414 and 424 are gate lines coupled to the barrier gates $B_2$, as shown with white dots overlapping these lines and the respective barrier gates $B_2$, and otherwise various gate lines 412, 42, 414, 424 crossing gates (including plunger gates) are not coupled to these gates. For example, even though a gate line 424-1 crosses over all plunger gates and all barrier gates of the column 404-1, it is only electrically coupled to the barrier gates $B_2$, as shown with white dots overlapping the barrier gates $B_2$ in the column 404-1 and the gate line 424-1 (i.e., the gate line 424-1 is electrically isolated from the barrier gates $B_1$ or the plunger gates in the column 404-1). In another example, even though a gate line 412-1 crosses over all plunger gates and all barrier gates of the row 402-1, it is only electrically coupled to the barrier gates $B_1$, as shown with white dots overlapping the barrier gates $B_1$ in the row 402-1 and the gate line 412-1 (i.e., the gate line 412-1 is electrically isolated from the barrier gates $B_2$ or the plunger gates in the row 402-1).

Turning to the details of FIG. 21C, similar to FIG. 21A, a respective gate line 412 is electrically coupled to all first barrier gates $B_1$ of a given row 402, thus, for N rows there are N gate lines 412. Also similar to FIG. 21A is that the quantum dot device 400 shown in FIG. 21C includes, for each of the columns 404, a respective gate line 414 electrically coupled to (e.g., is electrically continuous among, or shared among) all second barrier gates $B_2$ arranged between a given pair of adjacent columns 404 in different rows 402 (except that in FIG. 21C the gate lines 414 are shown as dashed lines, whereas in FIG. 21C they were shown as solid lines, and except that their coupling to respective second barrier gates $B_2$ is shown with white dots in FIG. 21C instead of the black dots being used in FIG. 21A). Thus, for the quantum dot device 400 shown in FIG. 21C, for M columns 404 there may be M−1 gate lines 414.

Additional to FIG. 21A, in FIG. 21C, a respective gate line 422 is electrically coupled to all first barrier gates $B_1$ arranged between a given pair of adjacent rows 402 in different columns 404. For example, a gate line 422-1 is coupled to the barrier gate $B_1$ that is arranged along the column 404-1 between adjacent plunger gates in rows 402-1 and 402-2, the barrier gate $B_1$ that is arranged along the column 404-2 between adjacent plunger gates in rows 402-1 and 402-2, the barrier gate $B_1$ that is arranged along the column 404-3 between adjacent plunger gates in rows 402-1 and 402-2, and so on; and a gate line 422-2 is coupled to the barrier gate $B_1$ that is arranged along the column 404-1 between adjacent plunger gates in rows 402-2 and 402-3, the barrier gate $B_1$ that is arranged along the column 404-2 between adjacent plunger gates in rows 402-2 and 402-3, the barrier gate $B_1$ that is arranged along the column 404-3 between adjacent plunger gates in rows 402-2 and 402-3, and so on. Thus, for the quantum dot device 400 shown in FIG. 21C, for N rows 402 there may be N−1 gate lines 422.

Also additional to FIG. 21A, in FIG. 21C, a respective gate line 424 is electrically coupled to all first barrier gates $B_1$ arranged along a given column 404. For example, a gate line 424-1 is coupled to (e.g., is electrically continuous among, or shared among) all of the barrier gates $B_1$ that are between adjacent plunger gates arranged along the column 404-1, a gate line 424-2 is coupled to (e.g., is electrically continuous among, or shared among) all of the barrier gates $B_1$ that are between adjacent plunger gates arranged along the column 404-2, a gate line 424-3 is coupled to (e.g., is electrically continuous among, or shared among) all of the barrier gates $B_1$ that are between adjacent plunger gates arranged along the column 404-3, and a gate line 424-4 is coupled to (e.g., is electrically continuous among, or shared among) all of the barrier gates $B_1$ that are between adjacent plunger gates arranged along the column 404-4. Thus, for the quantum dot device 400 shown in FIG. 21C, for M columns 404 there may be M gate lines 424. The columns 404 may be rows of quantum dot formation regions 111, as described above.

The quantum dot device 400 shown in FIG. 21D is similar to that shown in FIG. 21B except that it further includes first and second barrier gates $B_1$, $B_2$ between adjacent pairs of plunger gates in a given column 404, similar to FIG. 21C. Thus, as shown in FIG. 21D, there are two barrier gates $B_1$, $B_2$ between a plunger gate in the row 402-1 and a plunger gate in the row 402-2, and two barrier gates $B_1$, $B_2$ between a plunger gate in the row 402-2 and a plunger gate in the row 402-3 for each of the columns 404-1, 404-2, 404-3, and 404-4, similar to FIG. 21C. In the quantum dot device 400 shown in FIG. 21D, coupling of the gate lines 422 to the barrier gates $B_1$ arranged between pairs of adjacent rows 402 in different columns 404, coupling of the gate lines 414 to all second barrier gates $B_2$ arranged between a given pair of adjacent columns 404 in different rows 402, and coupling of the respective gate lines 424 to all first barrier gates $B_1$ arranged along a given column 404 is the same as in FIG. 21C and, therefore, those descriptions are not repeated for FIG. 21D. What is different in the quantum dot device 400 shown in FIG. 21D compared to that shown in FIG. 21C is the same difference that was between the quantum dot device shown in FIG. 21B compared to that shown in FIG. 21A, namely, that, in FIG. 21D, not all of the barrier gates $B_1$ of a given row 402 are coupled to a single shared gate line 412 for that row. Instead, some of the barrier gates $B_1$ of a given row 402 of the quantum dot device 400 of FIG. 21D are coupled to a shared gate line 412 for that row, while other ones of the barrier gates $B_1$ of that row 402 are coupled to a shared gate line 413 for that row (i.e., there are two shared gate lines 412, 413, for each row 402). Coupling of the barrier gates $B_1$ of a given row 402 of the quantum dot device 400 of FIG. 21D to the gate lines 412 or 413 is the same as shown in FIG. 21B, except that the gate lines 413 are shown in FIG. 21D as dotted lines, and, therefore, descriptions of this coupling is not repeated for FIG. 21D.

In various embodiments, any of the gate lines of the quantum dot devices 400 described herein may be lines of any suitable electrically conductive material (e.g., a superconductor material), or a combination of electrically conductive materials. Descriptions of various gate lines "coupled" to various barrier gates refer to the gate lines being electrically coupled to (e.g., being in conductive contact with, or connected to) the barrier gates. FIGS. 21A-21D illustrate only some examples of how gate arrangements with multiple barrier gates between adjacent plunger gates may be implemented in quantum dot devices, and how various barrier gates may be addressed by different gate lines. Other embodiments of the quantum dot device 400 with different arrangements of multiple barrier gates between adjacent plunger gates in accordance with considerations described herein are possible and are within the scope of the present disclosure. The exact arrangement of multiple barrier gates between adjacent plunger gates may be selected for a particular design of a quantum dot device 400 based on considerations such as fabrication processes required to fabricate the device, the desired isolation between various gates, the desired control of the electrostatics in the device, complexity of routing signals to various gates, the desired accuracy of reading the states of different active quantum dots 142, etc.

FIG. 22 is a flow diagram of an example method 500 of operating a quantum dot device with multiple barrier gates between adjacent plunger gates, in accordance with some embodiments. As shown in FIG. 22, the method 500 includes a step 502 which involves applying voltages to first and second adjacent plunger gates to control formation of first and second quantum dots. For example, the step 502 may include applying a first plunger gate voltage to the first plunger gate (e.g., a gate $P_1$ of the gate arrangement 300) to control formation of a first quantum dot in a portion of the quantum well stack 146 below the first plunger gate, while simultaneously applying a second plunger gate voltage to the second plunger gate (e.g., a gate $P_2$ of the gate arrangement 300) to control formation of a second quantum dot in a portion of the quantum well stack 146 below the second plunger gate. The method 500 also includes a step 504, performed substantially simultaneously with the step 502, where the step 504 involves applying voltages to multiple barrier gates between the adjacent first and second adjacent plunger gates to control coupling of the first and second quantum dots formed by the step 502. For example, the step 504 may include applying a first barrier gate voltage to the first barrier gate (e.g., a gate $B_1$ of the gate arrangement 300) while simultaneously applying a second barrier gate voltage to the second barrier gate (e.g., a gate $B_2$ of the gate arrangement 300) to couple the first quantum dot formed in the portion of the quantum well stack 146 below the first plunger gate and the second quantum dot formed in the portion of the quantum well stack 146 below the second plunger gate. The method 500 may be used for various types of qubits. For example, in some embodiments, the quantum dots described herein may be parts of exchange-only qubits (also referred to as "triple-dot qubits").

Example Devices and Systems

Quantum dot devices with multiple barrier gates between adjacent plunger gates as described above may be implemented using any kind of qubit devices or be included in any kind of quantum processing devices/structures. Some examples of such devices/structures are illustrated in FIGS. 23A-23B, 24, and 25.

FIGS. 23A-23B are top views of a wafer 1100 and dies 1102 that may be formed from the wafer 1100, according to some embodiments of the present disclosure. Dies 1102 may include any of the quantum dot devices with multiple barrier gates between adjacent plunger gates disclosed herein, e.g., any embodiments of one or more gate arrangements 300 included in any kind of a quantum dot device (e.g., within any embodiments of the quantum dot devices 100 or 200), any embodiments of the quantum dot devices 400, any further embodiments of quantum dot devices with multiple barrier gates between adjacent plunger gates as described herein, or any combinations of such quantum dot devices. The wafer 1100 may include semiconductor material and may include one or more dies 1102 having conventional and quantum circuit device elements formed on a surface of the wafer 1100. Each of the dies 1102 may be a repeating unit of a semiconductor product that includes any suitable conventional and/or quantum circuit qubit device. After the fabrication of the semiconductor product is complete, the wafer 1100 may undergo a singulation process in which each of the dies 1102 is separated from one another to provide discrete "chips" of the semiconductor product. A die 1102 may include, or be included in, a quantum circuit component. In some embodiments, the wafer 1100 or the die 1102 may include a memory device (e.g., a static random-access memory (SRAM) device), a logic device (e.g., AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 2002 of FIG. 25) or other logic that is configured to store information in the memory devices or execute instructions stored in the memory array.

Figure 24:
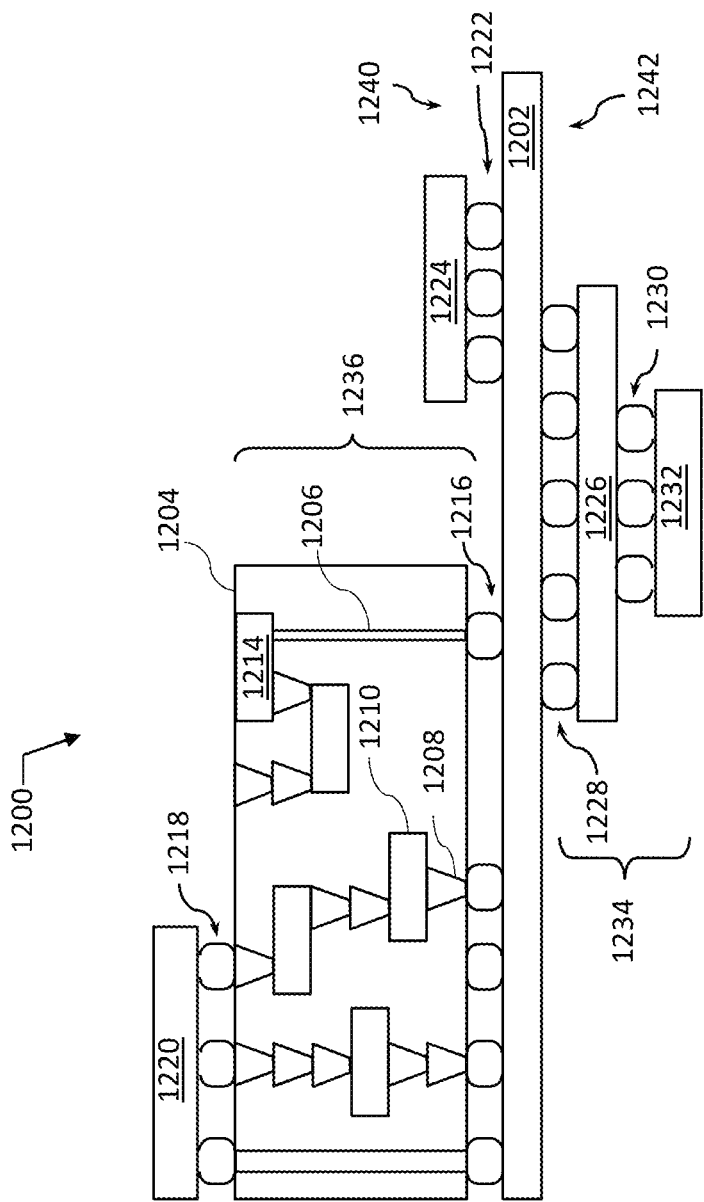
FIG. 24 is a cross-sectional side view of a device assembly that may include one or more of quantum dot devices disclosed herein.

FIG. 24 is a cross-sectional side view of a device assembly 1200 that may include any of the embodiments of the quantum dot devices with multiple barrier gates between adjacent plunger gates as disclosed herein. The device assembly 1200 includes a number of components disposed on a circuit board 1202. The device assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. In other embodiments, the circuit board 1202 may be a package substrate or flexible board.

The IC device assembly 1200 illustrated in FIG. 24 may include a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 24), male and female portions of a socket, an adhesive, an underfill material, and/or any other suitable electrical and/or mechanical coupling structure.

The package-on-interposer structure 1236 may include a package 1220 coupled to an interposer 1204 by coupling components 1218. The coupling components 1218 may take any suitable form for the application, such as the forms discussed above with reference to the coupling components 1216. Although a single package 1220 is shown in FIG. 24, multiple packages may be coupled to the interposer 1204; indeed, additional interposers may be coupled to the interposer 1204. The interposer 1204 may provide an intervening substrate used to bridge the circuit board 1202 and the package 1220. The package 1220 may be a quantum circuit device package as described herein, e.g., a package including any of the quantum dot devices with multiple barrier gates between adjacent plunger gates as described herein; or may be a conventional IC package, for example. Generally, the interposer 1204 may spread a connection to a wider pitch or reroute a connection to a different connection. For example, the interposer 1204 may couple the package 1220 (e.g., a die) to a ball grid array (BGA) of the coupling components 1216 for coupling to the circuit board 1202. In the embodiment illustrated in FIG. 24, the package 1220 and the circuit board 1202 are attached to opposing sides of the interposer 1204; in other embodiments, the package 1220 and the circuit board 1202 may be attached to a same side of the interposer 1204. In some embodiments, three or more components may be interconnected by way of the interposer 1204.

The interposer 1204 may be formed of an epoxy resin, a fiberglass-reinforced epoxy resin, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The device assembly 1200 may include a package 1224 coupled to the first face 1240 of the circuit board 1202 by coupling components 1222. The coupling components 1222 may take the form of any of the embodiments discussed above with reference to the coupling components 1216, and the package 1224 may take the form of any of the embodiments discussed above with reference to the package 1220. The package 1224 may be a package including any quantum dot devices with multiple barrier gates between adjacent plunger gates disclosed herein; or may be a conventional IC package, for example.

The device assembly 1200 illustrated in FIG. 24 includes a package-on-package structure 1234 coupled to the second face 1242 of the circuit board 1202 by coupling components 1228. The package-on-package structure 1234 may include a package 1226 and a package 1232 coupled together by coupling components 1230 such that the package 1226 is disposed between the circuit board 1202 and the package 1232. The coupling components 1228 and 1230 may take the form of any of the embodiments of the coupling components 1216 discussed above, and the packages 1226 and 1232 may take the form of any of the embodiments of the package 1220 discussed above. Each of the packages 1226 and 1232 may be a qubit device package as described herein or may be a conventional IC package, for example.

Figure 25:
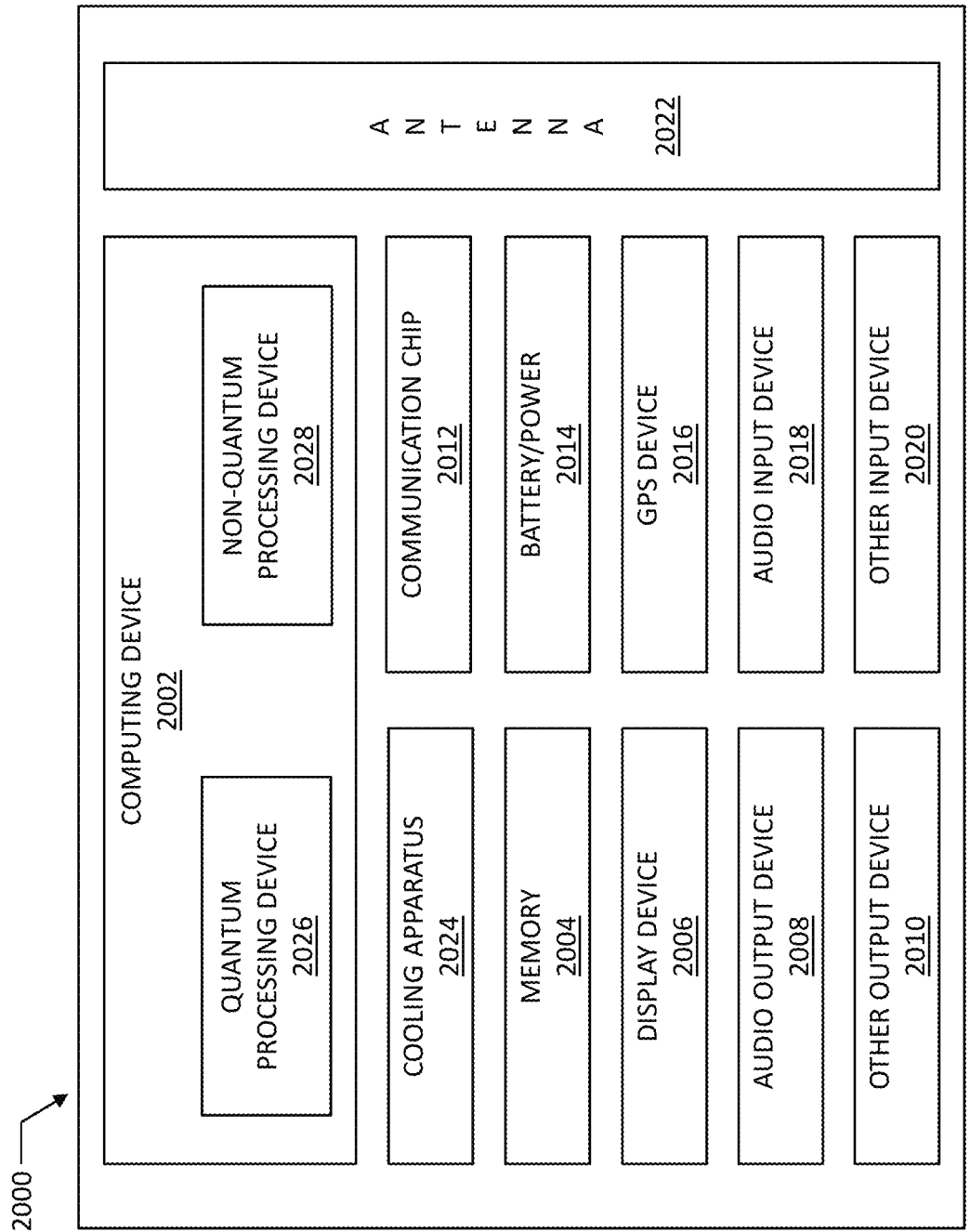
FIG. 25 is a block diagram of an example quantum computing device that may include one or more of quantum dot devices disclosed herein, in accordance with various embodiments.

FIG. 25 is a block diagram of an example quantum computing device 2000 that may include any of the quantum dot devices with multiple barrier gates between adjacent plunger gates as disclosed herein, or any combinations of such quantum dot devices. Several components are illustrated in FIG. 25 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard), and may be included in, or include, any of the quantum circuits with any of the quantum dot devices with multiple barrier gates between adjacent plunger gates as described herein. In some embodiments, various ones of these components may be fabricated onto a single system-on-a-chip (SoC) die. Additionally, in various embodiments, the quantum computing device 2000 may not include one or more of the components illustrated in FIG. 25, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2018 or an audio output device 2008, but may include audio input or output device interface circuitry (e.g., connectors and supporting circuitry) to which an audio input device 2018 or audio output device 2008 may be coupled.

The quantum computing device 2000 may include a cooling apparatus 2024. The cooling apparatus 2024 may maintain a quantum processing device 2026 of the quantum computing device 2000, in particular the qubit devices as described herein, at a predetermined low temperature during operation to avoid qubit decoherence and to reduce the effects of scattering in the quantum processing device 2026. In some embodiments, a non-quantum processing device 2028 of the quantum computing device 2000 (and various other components of the quantum computing device 2000) may not be cooled by the cooling apparatus 2030 and may instead operate at room temperature.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include any of the quantum dot devices with multiple barrier gates between adjacent plunger gates as disclosed herein, and may perform data processing by performing operations on the qubits that may be generated in the quantum dot devices 300, and monitoring the result of those operations. For example, as discussed above, different qubits may be allowed to interact, the quantum states of different qubits may be set or transformed, and the quantum states of different qubits may be read. The quantum processing device 2026 may be a universal quantum processor, or specialized quantum processor configured to run one or more quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random-access memory (DRAM)), nonvolatile memory (e.g., read-only memory (ROM)), flash memory, solid-state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random-access memory (eDRAM) or spin transfer torque magnetic random-access memory (STT-MRAM).

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data using modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2018 (or corresponding interface circuitry, as discussed above). The audio input device 2018 may include any device that generates a signal representative of a sound, such as microphones, microphone arrays, or digital instruments (e.g., instruments having a musical instrument digital interface (MIDI) output).

The quantum computing device 2000 may include a GPS device 2016 (or corresponding interface circuitry, as discussed above). The GPS device 2016 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Select Examples

The following paragraphs provide examples of various ones of the embodiments disclosed herein.

Example 1 provides a quantum dot device that includes a quantum well stack; a first plunger gate and a second plunger gate above the quantum well stack; and a first barrier gate and a second barrier gate above the quantum well stack, where the first barrier gate is between the first plunger gate and the second barrier gate, and the second barrier gate is between the first barrier gate and the second plunger gate.

Example 2 provides the quantum dot device according to example 1, where the first plunger gate, the first barrier gate, the second barrier gate, and the second plunger gate are arranged along a substantially straight line (e.g., above a quantum dot formation row in the quantum well stack).

Example 3 provides the quantum dot device according to examples 1 or 2, where, for the first barrier gate, nearest two gates are the first plunger gate and the second barrier gate, and, for the second barrier gate, nearest two gates are the first barrier gate and the second plunger gate.

Example 4 provides the quantum dot device according to any one of examples 1-3, where the first plunger gate and the second barrier gate are substantially equidistant to the first barrier gate, and the first barrier gate and the second plunger gate are substantially equidistant to the second barrier gate.

Example 5 provides the quantum dot device according to any one of examples 1-4, where no plunger gates are present between the first plunger gate and the second plunger gate. In further embodiments, additional barrier gates may be present between the first plunger gate and the second plunger gate.

Example 6 provides the quantum dot device according to any one of examples 1-5, further including a first interconnect to control the first barrier gate, and a second interconnect to control the second barrier gate, where the first barrier gate and the second barrier gate are electrically isolated from one another.

Example 7 provides the quantum dot device according to any one of examples 1-6, where each of the first plunger gate, the first barrier gate, the second barrier gate, and the second plunger gate includes a gate metal and a gate dielectric, and the gate dielectric is between the quantum well stack and the gate metal.

Example 8 provides the quantum dot device according to example 7, further including an insulating material above the quantum well stack, where each of the first plunger gate, the first barrier gate, the second barrier gate, and the second plunger gate includes a respective via extending through the insulating material to the quantum well stack, the gate metal at least partially fills the via, and the gate dielectric is at a bottom of the via, between the quantum well stack below the via and the gate metal in the via.

Example 9 provides the quantum dot device according to any one of examples 1-8, where the quantum dot device is a quantum computing device, the quantum computing device includes a quantum processing device and a non-quantum processing device, the quantum processing device includes the quantum well stack, the first plunger gate, the first barrier gate, the second barrier gate, and the second plunger gate, and the non-quantum processing device is coupled to the quantum processing device and is to control voltages applied to the first plunger gate, the first barrier gate, the second barrier gate, and the second plunger gate.

Example 10 provides the quantum dot device according to example 9, where the quantum computing device further includes a memory device to store data generated during operation of the quantum processing device.

Example 11 provides the quantum dot device according to example 10, where the memory device is configured to store instructions for a quantum computing algorithm to be executed by the quantum processing device.

Example 12 provides the quantum dot device according to any one of examples 9-11, where the quantum computing device further includes a cooling apparatus configured to maintain the temperature of the quantum processing device below 5 degrees Kelvin.

Example 13 provides a quantum dot device that includes a quantum well stack; a plurality of plunger gates arranged along a row above the quantum well stack; and a plurality of pairs of barrier gates above the quantum well stack, where an individual pair of barrier gates of the plurality of pairs of barrier gates is between each nearest neighbor pair of plunger gates.

Example 14 provides the quantum dot device according to example 13, where, for at least two pairs of barrier gates, first barrier gates of the at least two pairs of barrier gates are electrically coupled to a single gate line (i.e., these first barrier gates are controlled using a single gate line, not individually).

Example 15 provides the quantum dot device according to example 14, where the gate line is a first gate line, and for the at least two pairs of barrier gates, second barrier gates of the at least two pairs of barrier gates are coupled to individual (i.e., respective) second gate lines.

Example 16 provides the quantum dot device according to any one of examples 13-15, where the quantum dot device is a quantum computing device, the quantum computing device includes a quantum processing device and a non-quantum processing device, the quantum processing device includes the quantum well stack, the plurality of plunger gates, and the plurality of pairs of barrier gates, and the non-quantum processing device is coupled to the quantum processing device and is to control voltages applied to the plurality of plunger gates and the plurality of pairs of barrier gates.

Example 17 provides the quantum dot device according to example 16, where the quantum computing device further includes a memory device to store data generated during operation of the quantum processing device.

Example 18 provides the quantum dot device according to example 16, where the memory device is configured to store instructions for a quantum computing algorithm to be executed by the quantum processing device.

Example 19 provides the quantum dot device according to any one of examples 16-18, where the quantum computing device further includes a cooling apparatus configured to maintain the temperature of the quantum processing device below 5 degrees Kelvin.

Example 20 provides a method of operating a quantum dot device that includes a quantum well stack, first and second plunger gates above the quantum well stack, and first and second barrier gates above the quantum well stack, where the first and second barrier gates are between the first and second plunger gates. The method includes applying a first plunger gate voltage to the first plunger gate to control formation of a first quantum dot in a portion of the quantum well stack below the first plunger gate, applying a second plunger gate voltage to the second plunger gate to control formation of a second quantum dot in a portion of the quantum well stack below the second plunger gate, and applying a first barrier gate voltage to the first barrier gate while simultaneously applying a second barrier gate voltage to the second barrier gate to couple the first quantum dot and the second quantum dot.

Example 21 provides the method according to example 20, where the first barrier voltage and the second barrier voltage are applied substantially simultaneously with applying the first plunger gate voltage and the second plunger gate voltage.

Example 22 provides the method according to any one of examples 20-21, where each of the first quantum dot and the second quantum dot is a part of an exchange-only qubit (also referred to as a "triple-dot qubit").

Example 23 provides a quantum dot device that includes a quantum well stack; a plurality of plunger gates arranged along N rows and M columns of an array of gates above the quantum well stack, where each of N and M is an integer greater than 1; a plurality of barrier gates above the quantum well stack; N first gate lines; and M−1 second gate lines, where for each row of the N rows, a first barrier gate and a second barrier gate are between each nearest neighbor pair of plunger gates arranged along the row, for each row of the N rows, the first barrier gates between different nearest neighbor pairs of plunger gates arranged along the row are electrically coupled to one of the N first gate lines, and, for each pair of columns of the M columns, the second barrier gates between different nearest neighbor pairs of plunger gates arranged along the N rows of the pair of columns are electrically coupled to one of the M−1 second gate lines.

Example 24 provides the quantum dot device according to example 23, where the quantum dot device is a quantum computing device, the quantum computing device includes a quantum processing device and a non-quantum processing device, the quantum processing device includes the quantum well stack, the plurality of plunger gates, the plurality of barrier gates, the N first gate lines, and the M−1 second gate lines, and the non-quantum processing device is coupled to the quantum processing device and is to control voltages applied to the plurality of plunger gates and the plurality of barrier gates.

Example 25 provides the quantum dot device according to example 24, where the quantum computing device further includes a memory device to store data generated during operation of the quantum processing device.

Example 26 provides the quantum dot device according to example 25, where the memory device is configured to store instructions for a quantum computing algorithm to be executed by the quantum processing device.

Example 27 provides the quantum dot device according to any one of examples 24-26, where the quantum computing device further includes a cooling apparatus configured to maintain the temperature of the quantum processing device below 5 degrees Kelvin.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A quantum dot device, comprising:
   a quantum well stack;
   a first plunger gate and a second plunger gate above the quantum well stack; and
   a first barrier gate and a second barrier gate above the quantum well stack,
   wherein:
   the first barrier gate is between the first plunger gate and the second barrier gate,
   the second barrier gate is between the first barrier gate and the second plunger gate, and
   three or more of the first plunger gate, the first barrier gate, the second barrier gate, and the second plunger gate are along a substantially straight line.

2. The quantum dot device according to claim 1, wherein:
   the first plunger gate and the second barrier gate are substantially equidistant to the first barrier gate, and
   the first barrier gate and the second plunger gate are substantially equidistant to the second barrier gate.

3. The quantum dot device according to claim 1, wherein no plunger gates are present between the first plunger gate and the second plunger gate.

4. The quantum dot device according to claim 1, wherein:
   an individual one of the first plunger gate, the first barrier gate, the second barrier gate, and the second plunger gate includes a gate metal and a gate dielectric, and
   the gate dielectric is between the quantum well stack and the gate metal.

5. The quantum dot device according to claim 1, wherein:
   the quantum dot device is a quantum computing device,
   the quantum computing device includes a quantum processing device and a non-quantum processing device,
   the quantum processing device includes the quantum well stack, the first plunger gate, the first barrier gate, the second barrier gate, and the second plunger gate, and
   the non-quantum processing device is coupled to the quantum processing device and is to control voltages applied to the first plunger gate, the first barrier gate, the second barrier gate, and the second plunger gate.

6. The quantum dot device according to claim 5, wherein the quantum computing device further includes a memory device to store data generated during operation of the quantum processing device.

7. The quantum dot device according to claim 5, wherein the quantum computing device further includes a cooling apparatus to maintain a temperature of the quantum processing device below 5 degrees Kelvin.

8. A quantum dot device, comprising:
   a quantum well stack;
   a plurality of plunger gates above the quantum well stack; and
   a plurality of pairs of barrier gates above the quantum well stack,
   wherein, in a top-down view of the quantum dot device, a pair of barrier gates of the plurality of pairs of barrier gates is between two nearest neighbor plunger gates of the plurality of plunger gates.

9. The quantum dot device according to claim 8, wherein, for at least two pairs of barrier gates, first barrier gates of the at least two pairs of barrier gates are coupled to a single gate line.

10. The quantum dot device according to claim 9, wherein:
    the gate line is a first gate line, and
    for the at least two pairs of barrier gates, second barrier gates of the at least two pairs of barrier gates are coupled to individual second gate lines.

11. The quantum dot device according to claim 8, wherein:
    the quantum dot device is a quantum computing device,
    the quantum computing device includes a quantum processing device and a non-quantum processing device,
    the quantum processing device includes the quantum well stack, the plurality of plunger gates, and the plurality of pairs of barrier gates, and
    the non-quantum processing device is coupled to the quantum processing device and is to control voltages applied to the plurality of plunger gates and the plurality of pairs of barrier gates.

12. The quantum dot device according to claim 11, wherein the quantum computing device further includes a memory device to store data generated during operation of the quantum processing device.

13. The quantum dot device according to claim 1, wherein the first plunger gate and the second plunger gate are nearest neighbor plunger gates of a plurality of plunger gates of the quantum dot device.

14. The quantum dot device according to claim 8, wherein:
    the pair of barrier gates includes a first barrier gate and a second barrier gate,
    the two nearest neighbor plunger gates includes a first plunger gate and a second plunger gate,
    the first plunger gate and the second barrier gate are substantially equidistant to the first barrier gate, and
    the first barrier gate and the second plunger gate are substantially equidistant to the second barrier gate.

15. A quantum dot device, comprising:
    a quantum well stack;
    a plurality of plunger gates along N rows and M columns of an array of gates above the quantum well stack, where each of N and M is an integer greater than 1;
    a plurality of barrier gates above the quantum well stack;
    N first gate lines; and
    M−1 second gate lines,
    wherein:
      for each row of the N rows, a first barrier gate and a second barrier gate are between each nearest neighbor pair of plunger gates along the row,
      for each row of the N rows, the first barrier gates between different nearest neighbor pairs of plunger gates along the row are electrically coupled to one of the N first gate lines, and
      for each pair of columns of the M columns, the second barrier gates between different nearest neighbor pairs of plunger gates along the N rows of the pair of columns are electrically coupled to one of the M−1 second gate lines.

16. The quantum dot device according to claim 15, wherein:
    the quantum dot device is a quantum computing device,
    the quantum computing device includes a quantum processing device and a non-quantum processing device,
    the quantum processing device includes the quantum well stack, the plurality of plunger gates, the plurality of barrier gates, the N first gate lines, and the M−1 second gate lines, and
    the non-quantum processing device is coupled to the quantum processing device.

17. The quantum dot device according to claim 16, wherein the quantum computing device further includes a memory device to store data generated during operation of the quantum processing device.

18. The quantum dot device according to claim 17, wherein the memory device is to store instructions for a quantum computing algorithm to be executed by the quantum processing device.

19. The quantum dot device according to claim 16, wherein the quantum computing device further includes a cooling apparatus to maintain a temperature of the quantum processing device below 5 degrees Kelvin.

20. The quantum dot device according to claim 16, wherein the non-quantum processing device is to control voltages applied to the plurality of plunger gates and the plurality of barrier gates.

* * * * *